US012582016B2

(12) United States Patent     (10) Patent No.:   US 12,582,016 B2

Tsukuda et al.     (45) Date of Patent:    Mar. 17, 2026

(54) SEMICONDUCTOR DEVICE

(71) Applicant: RENESAS ELECTRONICS CORPORATION, Tokyo (JP)

(72) Inventors: Tatsuaki Tsukuda, Tokyo (JP); Tomohiro Nishiyama, Tokyo (JP); Toshiyuki Hata, Tokyo (JP); Koichi Hasegawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 640 days.

(21) Appl. No.: 17/993,390

(22) Filed: Nov. 23, 2022

(65) Prior Publication Data

US 2024/0170375 A1     May 23, 2024

(51) Int. Cl.
    *H01L 23/495*     (2006.01)
    *H01L 23/00*     (2006.01)
    *H01L 23/31*     (2006.01)

(52) U.S. Cl.
    CPC .... *H01L 23/49575* (2013.01); *H01L 23/3107* (2013.01); *H01L 23/49562* (2013.01); *H01L 24/32* (2013.01); *H01L 24/40* (2013.01); *H01L 24/48* (2013.01); *H01L 24/37* (2013.01); *H01L 24/45* (2013.01); *H01L 24/73* (2013.01); *H01L 2224/32145* (2013.01); *H01L 2224/32245* (2013.01); *H01L 2224/37147* (2013.01); *H01L 2224/40175* (2013.01); *H01L 2224/45144* (2013.01); *H01L 2224/45147*

(2013.01); *H01L 2224/48145* (2013.01); *H01L 2224/48245* (2013.01); *H01L 2224/73265* (2013.01)

(58) Field of Classification Search
    CPC ................................................ H01L 23/49575
    See application file for complete search history.

(56) References Cited

U.S. PATENT DOCUMENTS

| | | | |
|---|---|---|---|
| 9,147,647 B2 | 9/2015 | Kaneda | |
| 2024/0030148 A1* | 1/2024 | Koo ................... | H01L 23/49562 |
| 2024/0203844 A1* | 6/2024 | Hosokawa .............. | H01F 19/04 |

FOREIGN PATENT DOCUMENTS

| | | |
|---|---|---|
| JP | 10-261756 A | 9/1998 |
| JP | 2014-093431 A | 5/2014 |

* cited by examiner

*Primary Examiner* — Yu-Hsi D Sun
(74) *Attorney, Agent, or Firm* — Rimon P.C.

(57) ABSTRACT

The on-resistance of a semiconductor device is reduced. A package structure composing the semiconductor device includes a die pad, a plurality of leads, a first semiconductor chip having a power transistor and mounted on the die pad, and a second semiconductor chip including a control circuit for controlling the power transistor and mounted on the first semiconductor chip. Here, a source pad of the first semiconductor chip is electrically connected to a first lead and a seventh lead of the plurality of leads via a clip made of a material which is copper as a main component, and the width (and cross-sectional area) of the clip is larger than the width (and diameter) of a wire in plan view.

19 Claims, 35 Drawing Sheets

PKG2

MR

RB

CLP

PKG2

CLP

START

PREPARING LEAD FRAME     S201

MOUNTING SEMICONDUCTOR CHIP CHP1     S202

MOUNTING CLIP     S203

MOUNTING SEMICONDUCTOR CHIP CHP2     S204

WIRE BONDING     S205

RESIN SEALING     S206

END

SEMICONDUCTOR DEVICE

BACKGROUND

The present invention relates to a semiconductor device and, for example, to a technique that is effective when applied to a semiconductor device including a power transistor.

There are disclosed techniques listed below.
[Patent Document 1] Japanese Unexamined Patent Application Publication No. 2014-93431
[Patent Document 2] Japanese Unexamined Patent Application Publication No. H10-261756

Patent Document 1 discloses a semiconductor device including a semiconductor chip in which a power transistor having a trench gate structure is formed. In Patent Document 1, the on-resistance of the power transistor is reduced by making the conductive member (wire) that electrically connects the source electrode of the power transistor and the lead corresponding to the source electrode to each other.

Patent Document 2 discloses a technique for reducing an external resistance of a semiconductor device. In Patent Document 2, by arranging the inner lead along one long side of the tab, as a result of connecting the inner lead and the source electrode pad with a plurality of source wires, it is possible to greatly reduce the electrical resistance of the wire which is a main component of the external resistance.

SUMMARY

The operation of the power transistor is controlled by, for example, a control circuit. In this regard, it has been studied that a semiconductor chip on which a power transistor is formed and a semiconductor chip on which the above-described control circuit is formed (hereinafter, sometimes referred to as a control chip) are used as a single semiconductor device. This is because the semiconductor device can be miniaturized by packaging the semiconductor chip and the control chip in one package.

In recent years, a request for on-resistance of a semiconductor device has become severe. For example, the required on-resistance value is decreasing from "5 mΩ" to "1 mΩ to 2.5 mΩ". Therefore, in order to satisfy a required on-resistance value, a devising related to a semiconductor device including a semiconductor chip on which a power transistor is formed and a semiconductor chip on which a control circuit is formed (that is, a semiconductor device in which two semiconductor chips are packaged as one) is desired.

A semiconductor device according to an embodiment includes a chip mounting portion, a plurality of leads, a first semiconductor chip having a power transistor and mounted on the chip mounting portion, and a second semiconductor chip having a control circuit which controls the power transistor and mounted on the first semiconductor chip. Here, the first semiconductor chip has a first front surface, a first back surface opposite the first front surface, a source pad formed in the first front surface and electrically connected to a source of the power transistor, and a gate pad formed in the first front surface and electrically connected to a gate of the power transistor. The second semiconductor chip has a first pad electrically connected to the control circuit and a second pad electrically connected to the control circuit.

At this time, the first pad of the second semiconductor chip is electrically connected to a second lead of the plurality of leads via the first bonding wire made of a material which is one of gold and copper as a main component. The second pad of the second semiconductor chip is electrically connected to the gate pad of the first semiconductor chip via a second bonding wire made of a material which is one of gold and copper as a main component. The source pad of the first semiconductor chip is electrically connected to a first lead of the plurality of leads via a plate-shaped member made of a material which is copper as a main component. Also, in plan view, a width of the plate-shaped member is larger than a width of each of the first bonding wire and the second bonding wire. A semiconductor device according to an embodiment includes a first semiconductor chip in which a power transistor is formed, a second semiconductor chip in which a control circuit is formed, the control circuit controlling the power transistor, a plurality of bonding wires electrically connected to the power transistor, a chip mounting portion on which the first semiconductor chip is mounted, and a plurality of leads electrically connected to the plurality of bonding wires, respectively. Here, the chip mounting portion has a first side extending in the first direction, a second side facing the first side, a third side intersecting with the first side and the second side, and a fourth side facing the third side. The plurality of leads is arranged alongside in the first direction. The plurality of leads has a first lead extending along the third side and a second lead extending along the fourth side. The first lead extends to a position adjacent to the third side, and the second lead extends to a position adjacent to the fourth side. Here, the plurality of bonding wires has a first bonding wire electrically connected to the first lead and a second bonding wire electrically connected to the second lead. At this time, a joint portion of the first bonding wire and the first lead is located at a position adjacent to the third side, and a joint portion of the second bonding wire and the second lead is located at a position adjacent to the fourth side.

BRIEF DESCRIPTION OF THE DRAWINGS

FIG. 1 is a diagram showing a circuit configuration of a semiconductor device including a power transistor and a control circuit for controlling the power transistor.

FIG. 9A is a side view showing an enlarged partial region of the package structure in Modified Example 2 of the second embodiment seeing through the sealing body.

FIG. 9B is a side view showing an enlarged partial region of the package structure in another Modified Example 2 of the second embodiment seeing through the sealing body.

FIG. 9C is a side view showing an enlarged partial region of the package structure in yet another Modified Example 2 of the second embodiment seeing through the sealing body.

DETAILED DESCRIPTION

Figure 2A:
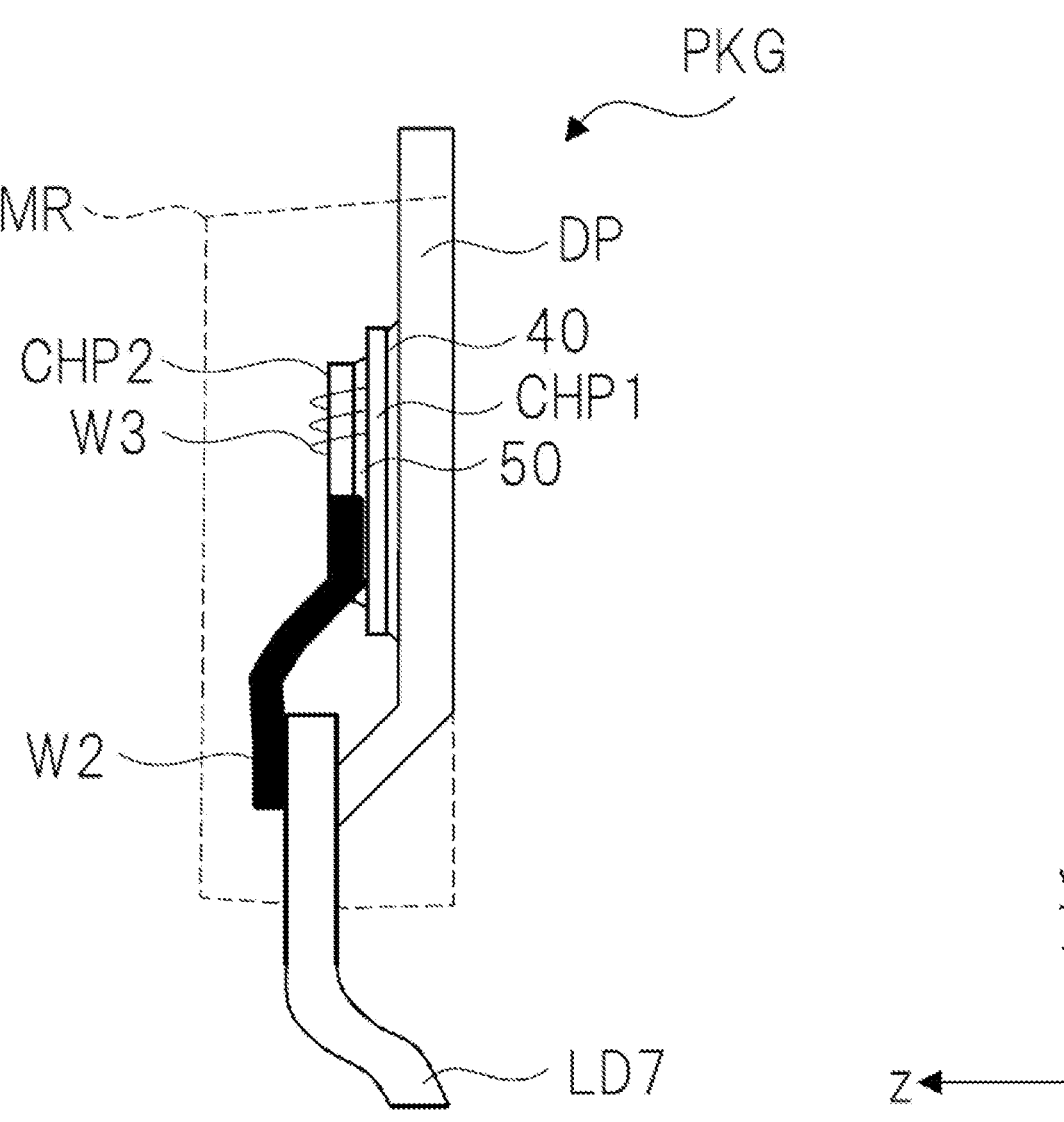
FIG. 2A is a side view of a package structure in Related Art seeing through a sealing body.

In all the drawings for explaining the embodiments, the same members are denoted by the same reference numerals in principle, and repetitive descriptions thereof are omitted. Note that even plan view may be hatched for the sake of clarity.

First Embodiment

<Configuration of Power Transistor and Control Circuit>

Figure 1:
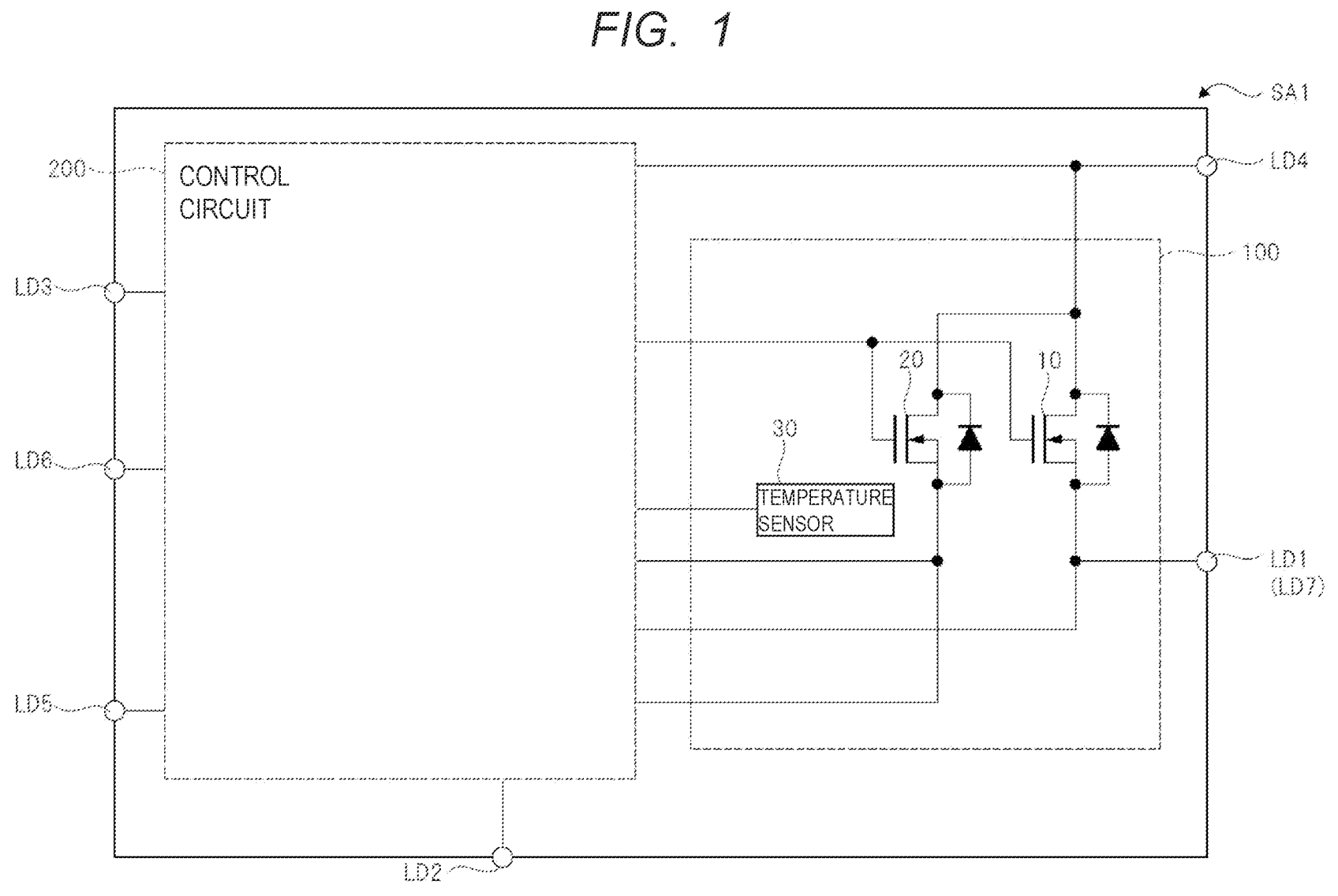

FIG. 1 is a diagram showing a circuit configuration of a semiconductor device SA1 including a power transistor and a control circuit for controlling the power transistor.

In FIG. 1, the semiconductor device SA1 includes a switching circuit 100 and a control circuit 200, and the switching circuit 100 includes a main transistor 10 including a power transistor, a sense transistor 20, and a temperature sensor 30.

In the switching circuit 100 configured as described above, the main transistor 10 is provided between a lead LD4 which is a power supply terminal for supplying a power supply potential and a lead LD1 (lead LD7) which is an output terminal, and functions as a switching element for turning on/off a current flowing between the power supply terminal and the output terminal. On the other hand, the sense transistor 20 has a function of detecting the current value of the current flowing through the main transistor 10, and the temperature sensor 30 has a function of detecting the temperature of the switching circuit 100.

Subsequently, the control circuit 200 has a function of controlling the switching circuit 100, and includes, for example, a pre-driver that applies a gate voltage to the gate electrode of the main transistor 10 and the gate electrode of the sense transistor 20. In FIG. 1, the control circuit 200 is electrically connected to a lead LD3 which is an input terminal of the semiconductor device SA1, a lead LD6, a lead LD2 which is a ground terminal, and a lead LD5 which is an output terminal for outputting an output from the control circuit 200 to the outside of the semiconductor device SA1.

The control circuit 200 is configured to control on/off of the main transistor 10 included in the switching circuit 100 based on a control signal inputted from the lead LD3. That is, the control circuit 200 controls on/off of the main transistor 10 by switching the gate voltage applied to the gate electrode of the main transistor 10.

In this way, by the on/off control of the main transistor 10, a current can be supplied from the lead LD1, which is an output terminal electrically connected to the source of the main transistor 10, to a load connected to the outside of the semiconductor device SA1.

In this manner, the semiconductor device SA1 is configured.

DESCRIPTION OF RELATED ART

Next, a related art related to the implementation configuration of the semiconductor-device SA1 will be described.

The "related art" referred to in this specification is not a known art, but is a technology having the problems found by the present inventors, and is a technology that is a premise of the present invention.

Figure 2B:
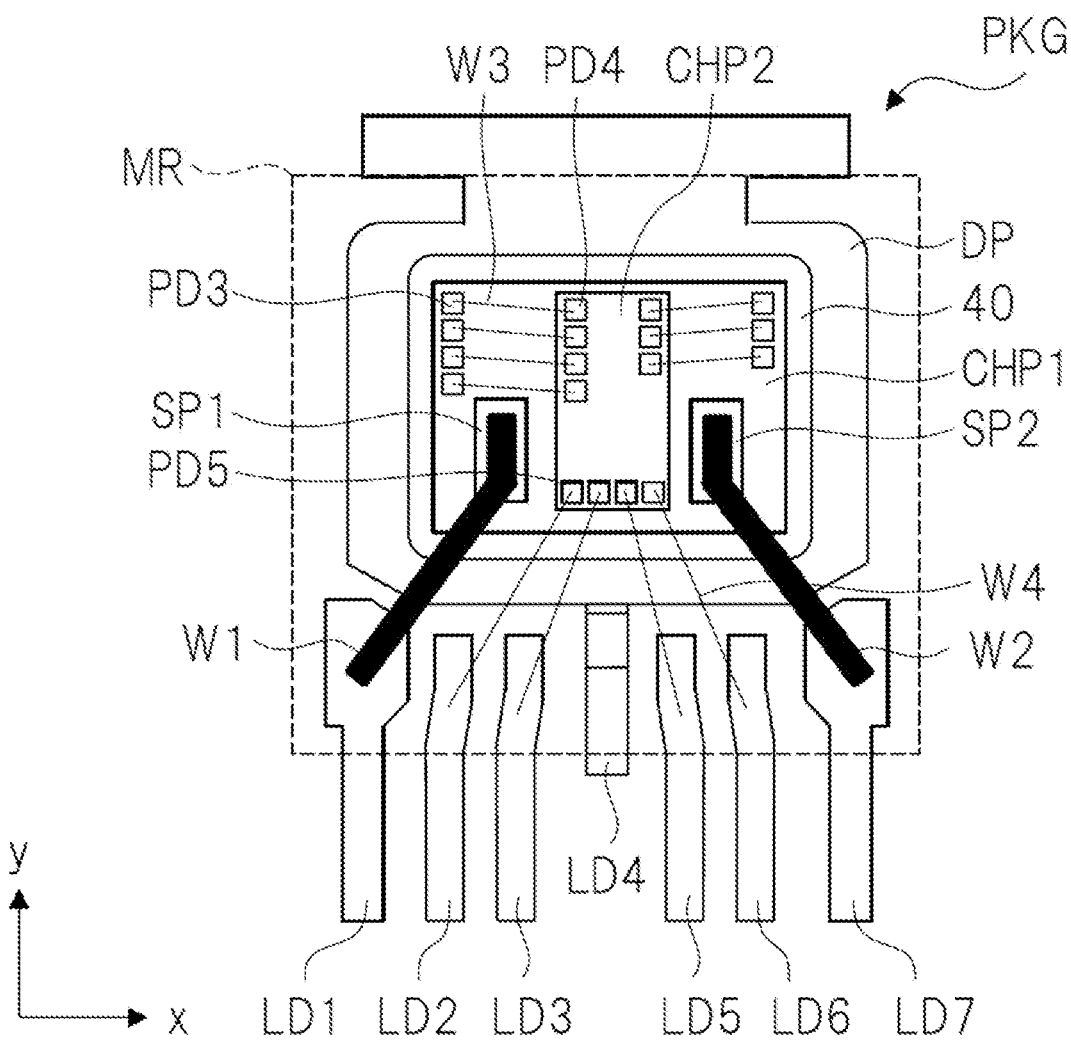
FIG. 2B is a top view of the package structure in Related Art seeing through the sealing body.
Figure 2C:
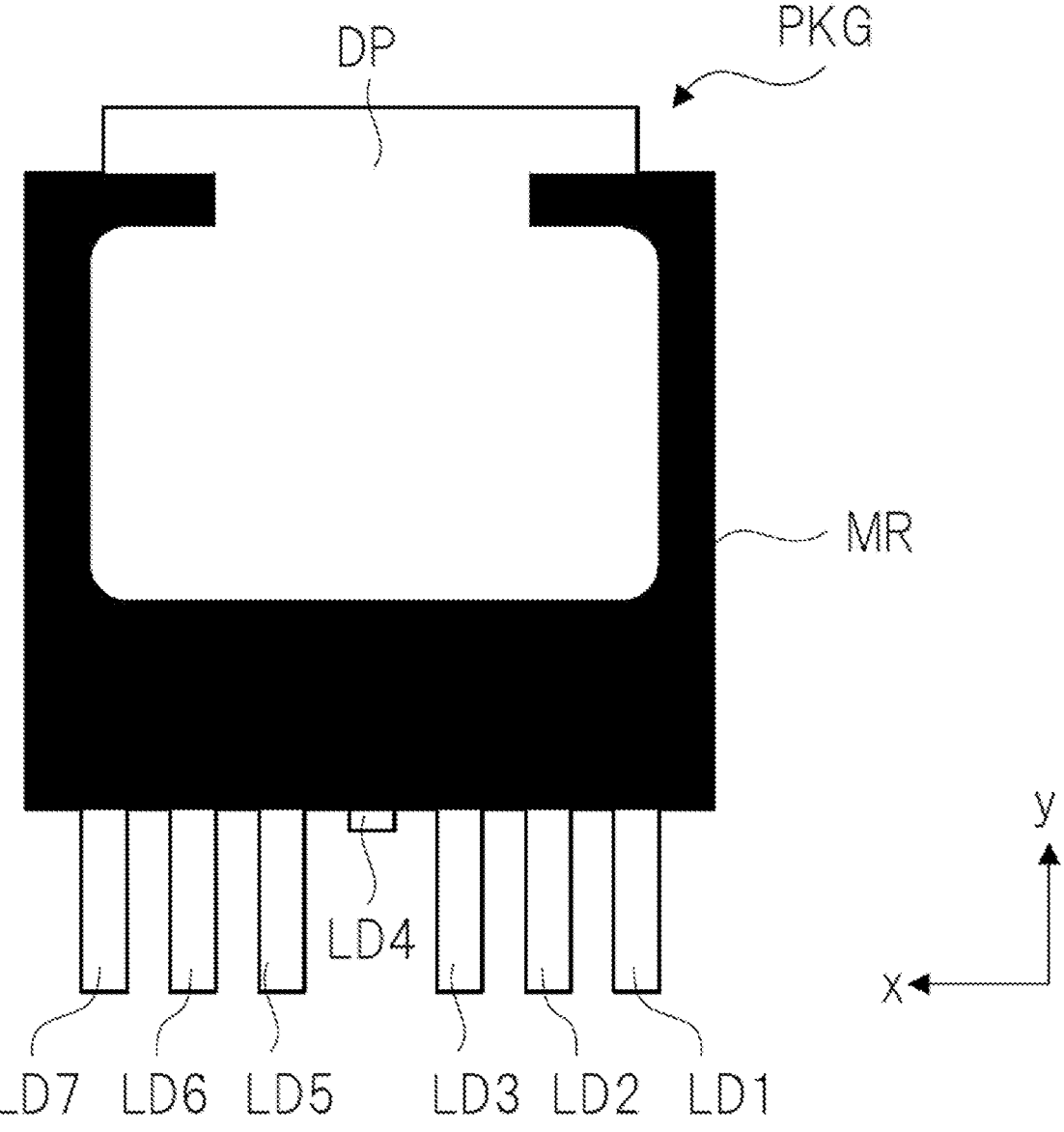
FIG. 2C is a bottom view of the package structure in Related Art.

FIGS. 2A to 2C are diagrams showing a package structure PKG in the related art.

In particular, FIG. 2A is a side view of a package structure PKG seeing through a sealing body MR, FIG. 2B is a top view of a package structure PKG seeing through the sealing body MR, and FIG. 2C is a bottom view of a package structure PKG.

As shown in FIG. 2A, the package structure PKG has a die pad DP which is a chip mounting portion, and a semiconductor chip CHP1 is mounted on the die pad DP via a conductive adhesive member 40 made of solder or silver paste as a raw material. A power transistor is formed in the semiconductor-chip CHP1. A semiconductor chip CHP2 is mounted on the semiconductor chip CHP1 via an insulating adhesive member 50. A control circuit for controlling the power transistor is formed in the semiconductor-chip CHP2. In addition, a source pad (not shown) formed on the front surface of the semiconductor-chip CHP1 and a lead LD7 are connected by a wire W2. At least the semiconductor chip CHP1 mounted on the die pad DP, the semiconductor chip CHP2 mounted on the semiconductor chip CHP1, and the wire W2 are covered with the sealing body MR.

Next, as shown in FIG. 2B, the front surface of the semiconductor chip CHP1 has a first region in which the source pad SP1 is formed, a second region in which the source pad SP2 is formed, and a third region located between the first region and the second region in plan view, and the third region is provided with the semiconductor chip CHP2 via an insulating adhesive material (not shown).

The source pad SP1 is connected to the lead LD1 via a wire W1. On the other hand, the source pad SP2 is connected to the lead LD2 via a wire W2. Further, a plurality of pads PD3 is formed on the semiconductor chip CHP1, while a plurality of pads PD4 and a plurality of pads PD5 are formed on the semiconductor chip CHP2. At this time, each of the plurality of pads PD3 is connected to each of the plurality of pads PD4 via a wire W3, each of the plurality of pads PD5 is connected to the lead LD2, lead LD3, lead LD5 or lead LD6. The die pad DP is connected to the lead LD4. Here, the width (and diameter) of the wire W1 and the wire W2 is larger than the width (and diameter) of the wire W3 and the wire W4.

Subsequently, as shown in FIG. 2C, a portion of the lower surface of the die pad DP is exposed from the back surface of the sealing body MR, and an outer lead portion of each of the lead LD1 to the lead LD7 protrudes from the sealing body MR. As described above, the package-structure PKG in the related art is implemented.

<Study for Improvement>

In recent years, a request for on-resistance of a semiconductor device has become severe. For example, the required on-resistance value is decreasing from "5 mΩ" to "1 mΩ to 2.5 mΩ". Therefore, in order to satisfy the required on-resistance, a devising related to a semiconductor device including a semiconductor chip CHP1 in which a power transistor is formed and a semiconductor chip CHP2 in which a control circuit is formed is desired.

In this regard, for example, the on-resistance of a power transistor formed on a semiconductor-chip CHP1 has been reduced, and consequently, the on-resistance caused by the package structure has been greatly affected. That is, in order to reduce the on-resistance of the entire semiconductor device, it is desired to reduce the on-resistance caused by the structure of the package structure. That is, in order to reduce the on-resistance value as required, it is necessary to devise a package structure.

The present inventors aim to reduce the on-resistance of the entire semiconductor device by reducing the on-resistance by paying attention to the on-resistance in, for example, the output path of the power transistor (that is, the path connecting the source pad of the main transistor and the lead LD1 (LD7) shown in FIG. 1) among the "on-resistances" caused by the structure of the package structure.

As a result of examining the package structure PKG in the related art, it has been clarified that there is room for improving from the viewpoint of reducing the on-resistance in the output path of the power transistor. Specifically, as shown in FIG. 2B, the current path between the source pad SP1 and the lead LD1 (current path by a wire W1) and the current path between the source pad SP2 and the lead LD7 (current path by a wire W2) become longer because the wire W1 connecting the source pad SP1 and the lead LD1 and the wire W2 connecting the source pad SP2 and the lead LD7 are bent (first factor).

In addition, the source pad SP1 and the lead LD1 are connected by one wire W1, and the source pad SP2 and the lead LD7 are connected by one wire W2 (second factor). Furthermore, although associated with the first factor, the wire W1 and the wire W2 are made of aluminum, resulting in, in the current path, a longer current path that is made of aluminum less conductive than copper (third factor). Due to the above-described factors, in the package-structure PKG in the related art, there is room for improving from the viewpoint of reducing the on-resistance.

Therefore, the present embodiment is devised to eliminate the disadvantages existing in the related art. Hereinafter, the technical idea of the present embodiment with this contrivance will be described.

Configuration of Package Structure in First Embodiment

Figure 3:
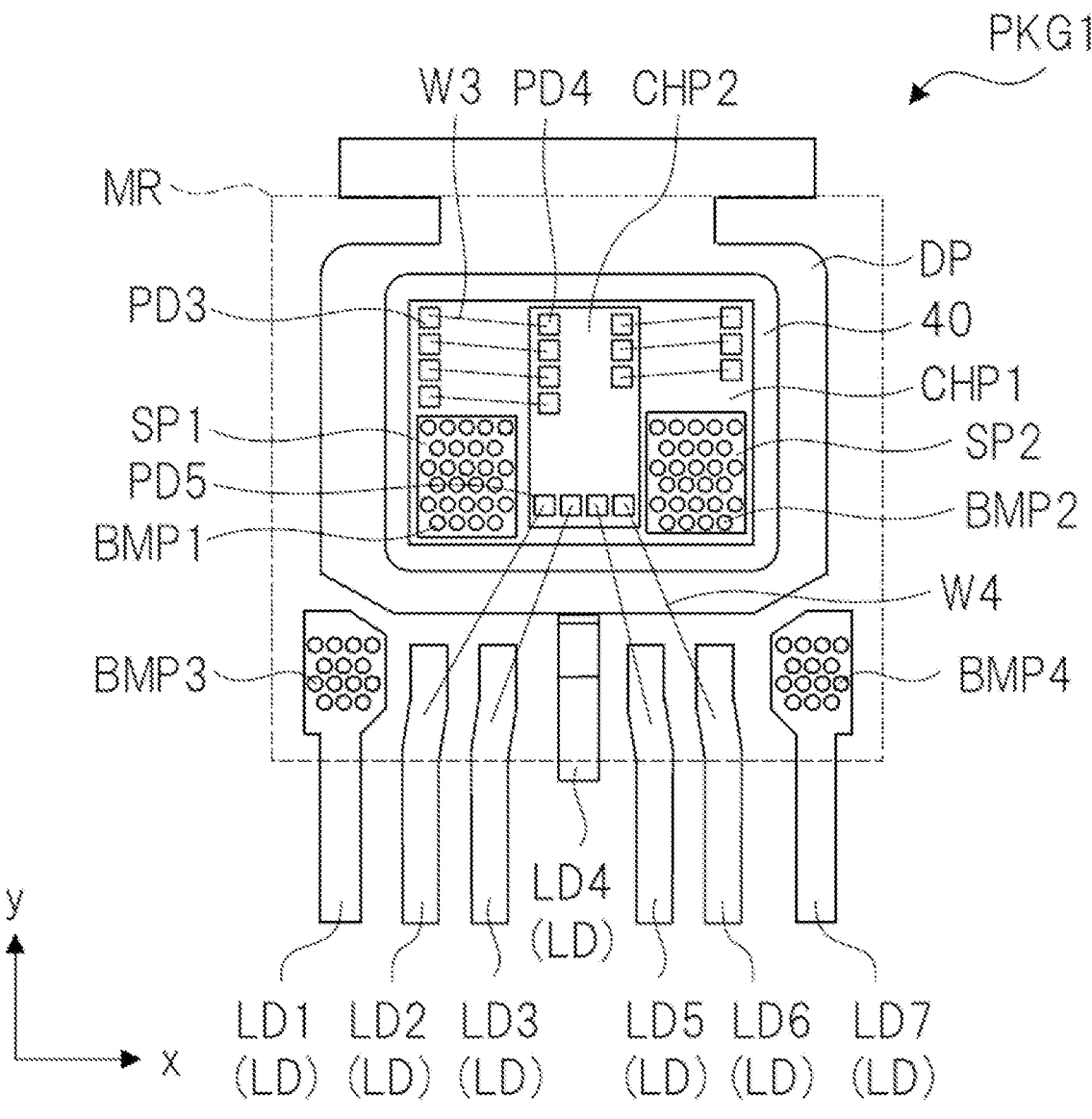
FIG. 3 is a diagram showing a construction excluding a clip in a package structure according to a first embodiment seeing through a sealing body.

FIG. 3 is a diagram showing a construction excluding a clip in a package structure PKG1 according to a first embodiment seeing through a sealing body MR.

In FIG. 3, the package structure PKG1 includes a die pad DP that is a chip mounting portion, and the die pad DP and the lead LD4 are connected to each other. On the other hand, a plurality of leads (lead LD1 to lead LD3 and lead LD5 to lead LD7) are disposed apart from the die pad DP. A semiconductor-chip CHP1 is mounted on the die pad DP via a conductive adhesive member 40 made of solder or silver paste. A power transistor is formed in the semiconductor-chip CHP1. A semiconductor chip CHP2 is mounted on the semiconductor chip CHP1 via an insulating adhesive member 50 (see FIG. 5A and FIG. 5B). A control circuit for controlling the power transistor is formed in the semiconductor chip CHP2.

Next, the front surface of the semiconductor chip CHP1 has a first region in which the source pad SP1 is formed, a second region in which the source pad SP2 is formed, and a third region located between the first region and the second region in plan view, and the third region is provided with the semiconductor chip CHP2 via an insulating adhesive member (not shown). In the first embodiment, a plurality of bump electrodes BMP1 are mounted on the source pad SP1, and a plurality of bump electrodes BMP2 are mounted on the source pad SP2.

Further, in the package structure PKG1, the lead LD1 (first lead) is disposed closer to the first region than the second region, and the lead LD7 (fourth lead) is disposed closer to the second region than the first region. The lead LD2 to the lead LD6 are disposed so as to be located between the lead LD1 and the lead LD7, and the leads other than the lead LD4 are disposed apart from the die pad DP, while the lead LD4 is connected to the die pad DP.

Here, a plurality of bump electrodes BMP3 are mounted on the post portion of the lead LD1, and a plurality of bump electrodes BMP4 are mounted on the post portion of the lead LD7.

Note that the bump electrodes BMP1 to BMP4 may be formed of bump electrodes made of solder, or may be formed of bump electrodes made of gold.

Next, as shown in FIG. 3, a plurality of pad PD3 are formed on the semiconductor chip CHP1, while a plurality of pads PD4 and a plurality of pad PD5 are formed on the semiconductor chip CHP2. At this time, each of the plurality of pads PD3 is connected to each of the plurality of pads PD4 via a wire W3, each of the plurality of pads PD5 is connected to the lead LD2, lead LD3, lead LD5 or lead LD6. The die pad DP is connected to the lead LD4.

Figure 4A:
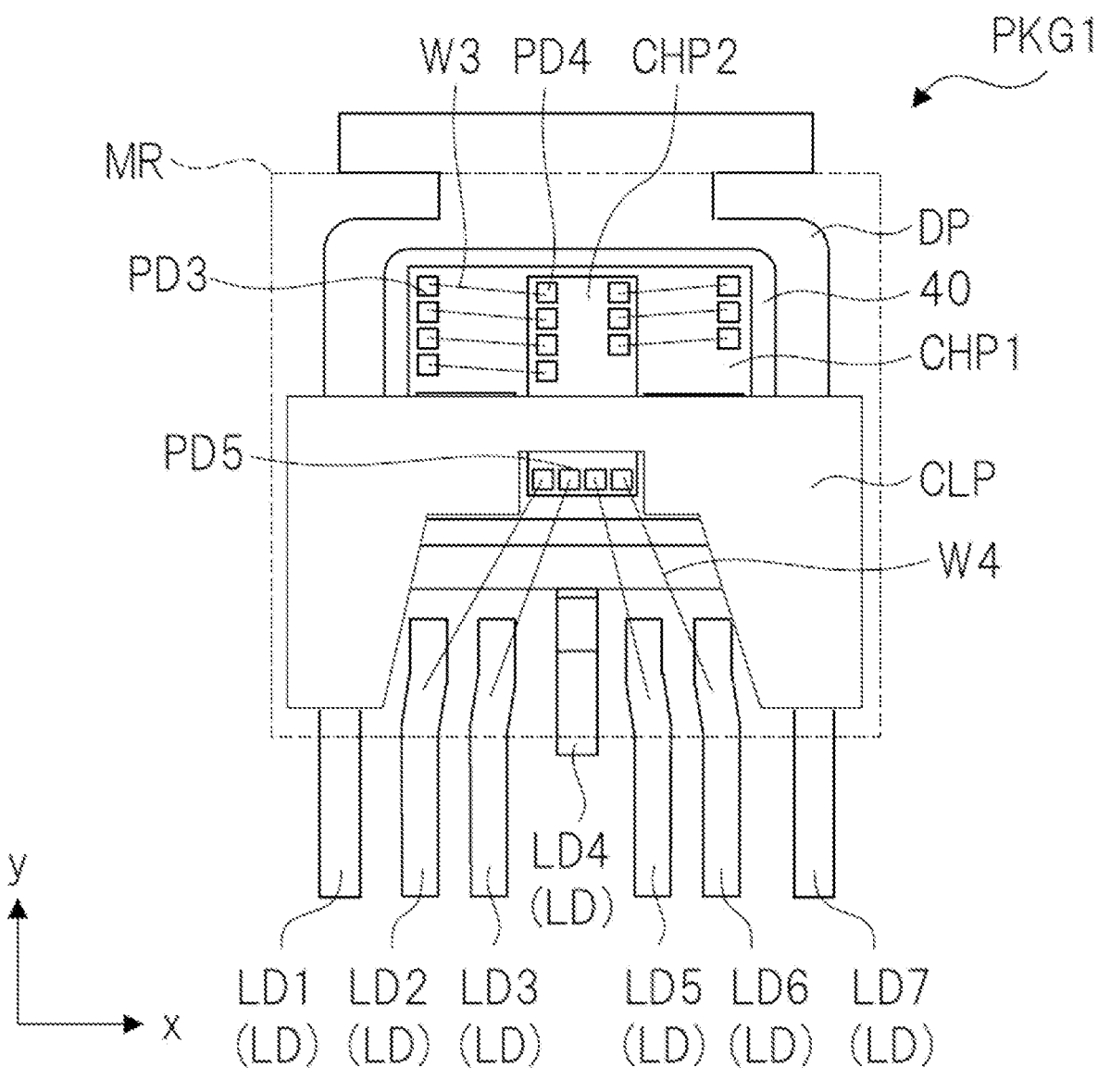
FIG. 4A is a top view of the package structure according to the first embodiment seeing through the sealing body.
Figure 4B:
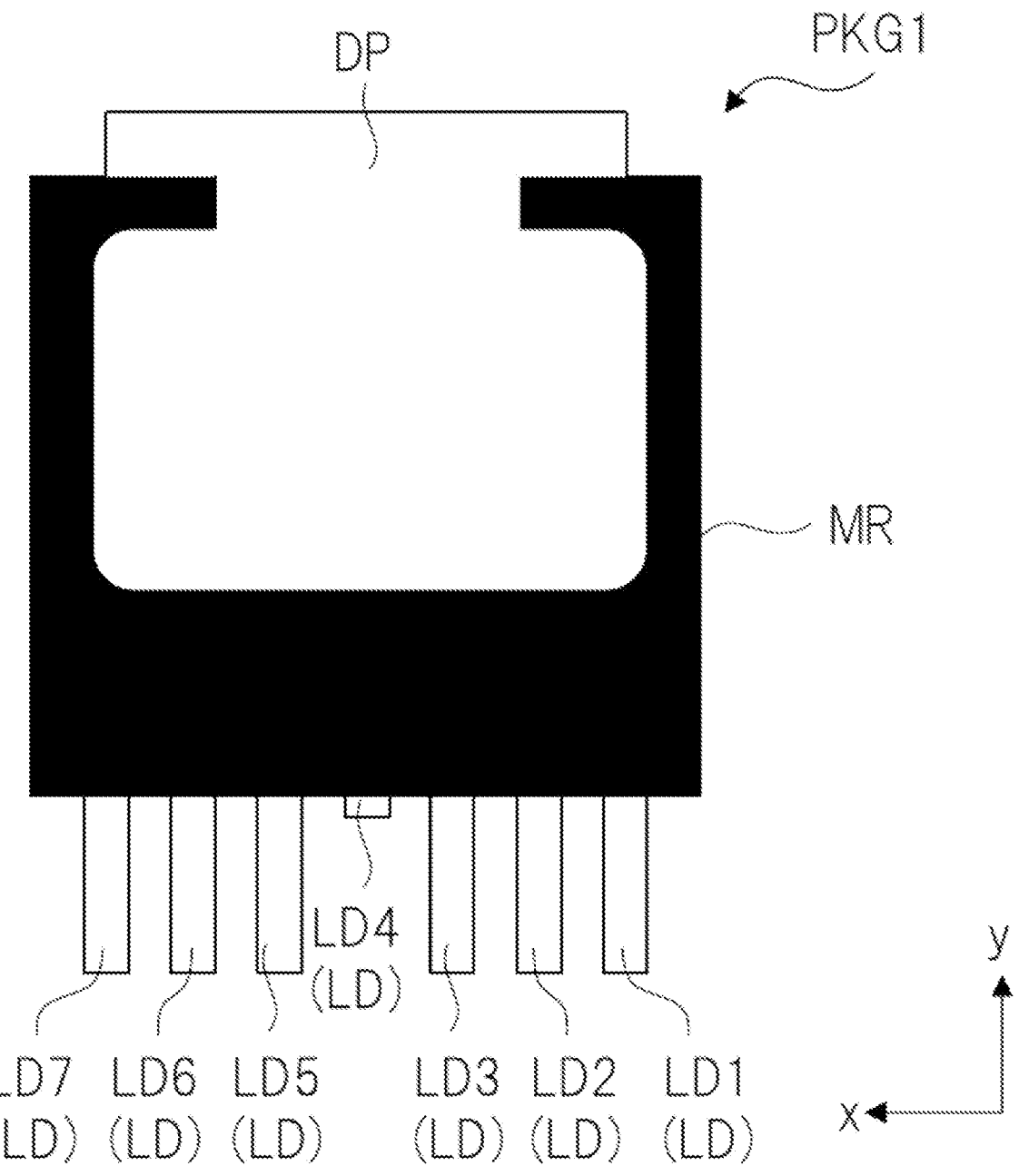
FIG. 4B is a bottom view of the package structure in the first embodiment.

FIGS. 4A to 4B are diagrams showing the package-structure PKG1 according to the first embodiment. In particular, FIG. 4A is a top view of a package structure PKG1 seeing through the sealing body MR, and FIG. 4B is a bottom view of the package structure PKG1.

In FIG. 4A, in addition to the structure shown in FIG. 3, the packaging structure PKG1 also shows a clip CLP which is a plate-shaped member. That is, as shown in FIGS. 3 and 4A, the clip CLP is arranged above the semiconductor chip CHP2 such that the clip CLP extends across the semiconductor chip CHP2, and the clip CLP is arranged on the source pad SP1, the source pad SP2, the lead LD1 and the lead LD7 via the bump electrode BMP1, the bump electrode BMP2, the bump electrode BMP3, and the bump electrode BMP4, respectively. Accordingly, the source pad SP1, the source pad SP2, the lead LD1, and the lead LD7 are electrically connected by the clipping CLP which is a conductive member. Thus, the clip CLP is electrically connected to the power transistor formed in the semiconductor-chip CHP1. At least the semiconductor chip CHP1 mounted on the die pad DP, the semiconductor chip CHP2 mounted on the semiconductor chip CHP1, and the clip CLP are covered with the sealing body MR.

Subsequently, as shown in FIG. 4B, a portion of the lower surface of the die pad MR is exposed from the back surface of the sealing body MR, and an outer lead portion of each of the lead LD1 to the lead LD7 protrudes from the sealing body MR.

Figure 5A:
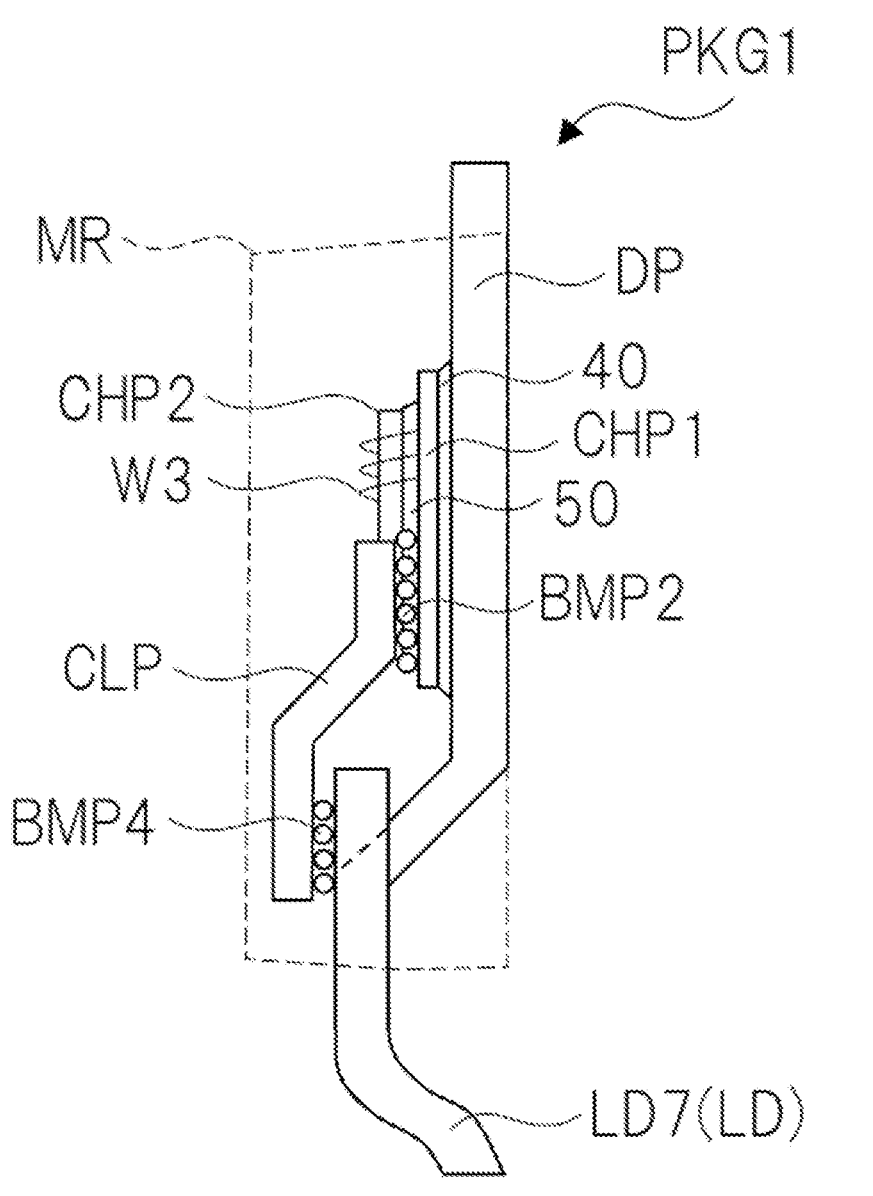
FIG. 5A is a side view of the package structure showing one connection form by the clip.
Figure 5A:
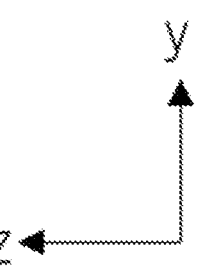
Figure 5B:
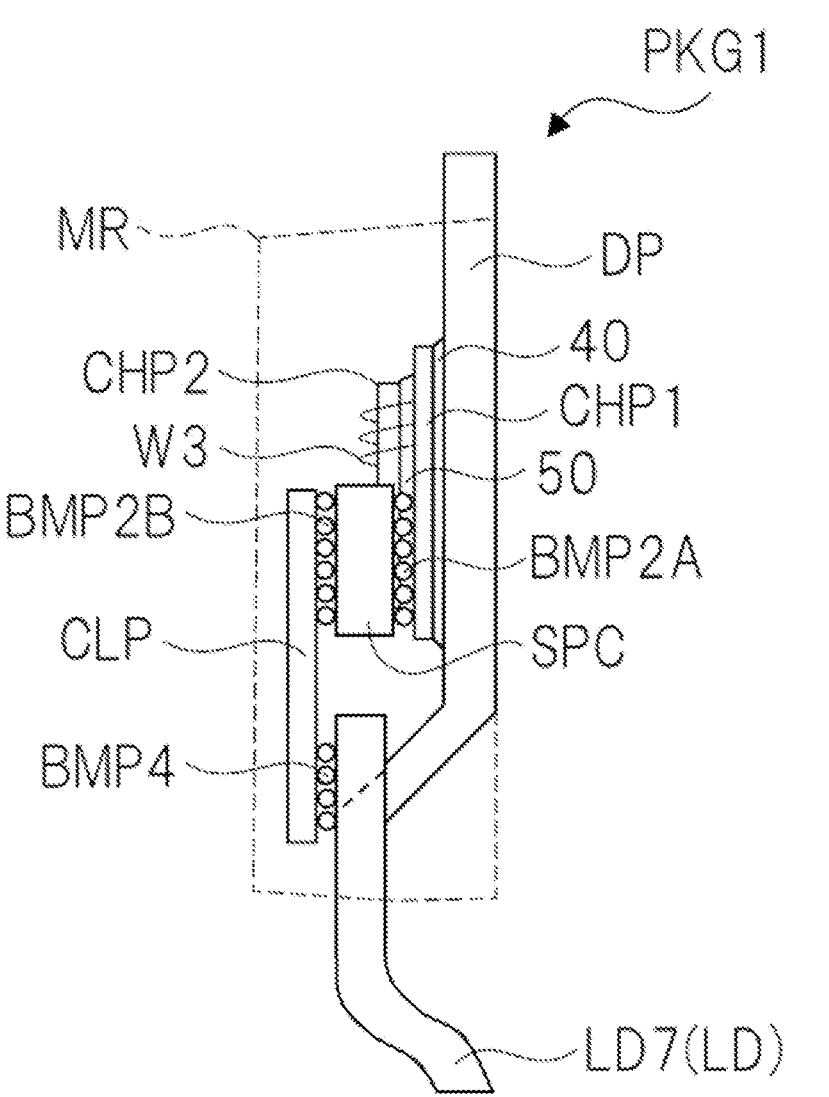
FIG. 5B is a side view of the package structure showing another connection form by the clip.
Figure 5B:
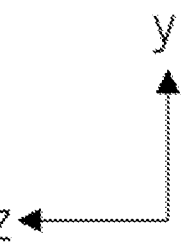

Here, in the package-structure PKG1, a configuration of connecting by the clip CLP will be described. FIG. 5A is a side view of the package structure PKG1 showing a configuration of connecting by a clip CLP, and FIG. 5B is a side view of the package structure PKG1 showing another configuration of connection by the clip CLP. The configuration of connecting by the clip CLP may be, for example, a form using the clip CLP subjected to a bending processing as shown in FIG. 5A, or a form using a spacer SPC and the clip CLP not subjected to an bending processing as shown in FIG. 5B. In this case, the source pad SP2 (see FIG. 3) of the semiconductor chip CHP1 and the spacer SPC are connected via the bump electrode BMP2A, and the spacer SPC and the clip CLP are connected via the bump electrode BMP2B. Although not shown in FIG. 5B, a spacer is also interposed between the clip CLP and the source pad SP1 of the semiconductor chip CHP1 (see FIG. 3), and the source pad SP1 and the clip CLP are electrically connected via the spacer. As described above, the package structure PKG1 according to the first embodiment is implemented and configured.

To summarize the above, the configuration of the package structure PKG1 in the first embodiment is as follows. That is, as shown in FIG. 3, the semiconductor device as the package structure PKG1 includes a die pad (chip mounting portion) DP, a plurality of leads LD, a semiconductor chip CHP1 having a power transistor and mounted on the die pad DP, and a semiconductor chip CHP2 having a control circuit which controls the power transistor and mounted on the semiconductor chip CHP1. Here, the semiconductor chip CHP1 has a first front surface, a first back surface opposite the first front surface, a source pad (source pad SP1, source pad SP2) formed in the first front surface and electrically connected to a source of the power transistor, and a gate pad (one pad included in the plurality of pads PD3) formed in the first front surface and electrically connected to a gate of the power transistor. On the other hand, the semiconductor chip CHP2 has a first pad (one pad included in the plurality of pads PD5) electrically connected to the control circuit, and a second pad (one pad included in the plurality of pads PD4) electrically connected to the control circuit. At this time, the first pad of the semiconductor chip CHP2 is electrically connected to a second lead (one lead of the leads LD2, LD3, LD5, LD6) of the plurality of leads LD via a first bonding wire (wire W4) made of a material which is one of gold and copper as a main component. The second pad of the semiconductor chip CHP2 is electrically connected to a gate pad (one pad included in the plurality of pads PD3) of the semiconductor chip CHP1 via a second bonding wire (wire W3) made of a material which is one of gold and copper as a main component. For example, as shown in FIG. 4A, the source pad (source pad SP1 or source pad SP2) of the semiconductor chip CHP1 is electrically connected to the first lead (lead LD1 or lead LD7) of the plurality of leads LD via a plate-shaped member (clip CLP) made of a material which is copper as a main component. Further, as shown in FIG. 4A, in plan view, the width of the clip CLP is larger than the width of the bonding wire (wire W3 or wire W4).

Note that the "plate-shaped member" as used herein is a conductive member made of a material which is copper as a main component, and is defined as a member whose width (and cross-sectional area) is larger than the width (and diameter) of the bonding wire. That is, the cross-sectional area of the "plate-shaped member" is defined as larger than the diameter (thickness) of the bonding wire. For example, "plate-shaped member" includes clip CLP, while wire W1, wire W2, wire W3 and wire W4 shown in FIG. 2B, and wire W3 and wire W4 shown in FIG. 3 or FIG. 4A are excluded.

Further, the configuration of the package structure PKG1 will be described.

For example, the die pad DP has an upper surface, which is a chip-mounting surface, and a lower surface, which is opposed to the upper surface. Further, the plurality of leads LD is arranged along the first side (for example, the second side S2 shown in FIG. 11A) of the die pad DP. The semiconductor device, which is the package structure PKG1, includes an sealing body MR that seals the semiconductor chip CHP1 and the semiconductor chip CHP2 such that a portion of each of the lower surface of the die pad DP and the plurality of leads LD is exposed. Further, the semiconductor-chip CHP1 includes a drain electrode formed on the first back surface and electrically connected to a drain of the power transistor. The semiconductor chip CHP2 includes a second front surface, a second back surface opposite the second front surface, a first pad (one pad included in the plurality of pads PD5) formed on the second front surface, and a second pad (one pad included in the plurality of pads PD4) formed on the second front surface.

At this time, the semiconductor chip CHP1 is mounted on the upper surface of the die pad DP via the conductive adhesive member 40 such that the first back surface faces the upper surface of the die pad DP. On the other hand, the semiconductor chip CHP2 is mounted on the first front surface of the semiconductor chip CHP1 via an insulating adhesive member so that the second back surface faces the first front surface of the semiconductor chip CHP1. The drain electrode of the semiconductor chip CHP1 is electrically connected to the die pad DP via the conductive adhesive member 40, and the third lead (lead LD4) of the plurality of leads LD is connected to the die pad DP. As described above, the package-structure PKG1 is implemented.

Features in First Embodiment

Next, the feature points in the first embodiment will be described.

As shown in FIGS. 3 and 4A, a characteristic point of the first embodiment is that the source pad SP1, the source pad SP2, the lead LD1, and the lead LD7 are electrically connected by a clip CLP, for example. Accordingly, the on-resistance of the package-structure PKG1 can be reduced.

For example, in the related art shown in FIG. 2B, a configuration in which the source pad SP1 and one wire W1 are connected, and a configuration in which the source pad SP2 and one wire W2 are connected are employed. In this case, the joint area between the source pad SP1 and the wire W1 and the joint area between the source pad SP2 and the wire W2 cannot be sufficiently increased. In the related art, the wire W1 and the lead LD1 are connected, and the wire W2 and the lead LD7 are connected. Therefore, the joint area between the wire W1 and the lead LD1 and the joint area between the wire W2 and the lead LD7 cannot be sufficiently increased.

On the other hand, in the first embodiment shown in FIGS. 3 and 4A, a configuration in which the source pad SP1 and the clip CLP are connected, and a configuration in which the source pad SP2 and the clip CLP are connected are adopted. In this case, the joint area between the source pad SP1 and the clip CLP can be increased to about the planar area of the source pad SP1, and the joint area between the source pad SP2 and the clip CLP can also be increased to about the planar area of the source pad SP2. Further, in the present embodiment, the joint area between the clip CLP and the lead LD1 and the joint area between the clip CLP and the lead LD7 can be sufficiently increased because the clip CLP and the lead LD1 are connected and the clip CLP and the lead LD7 are connected. That is, according to the first embodiment, as a result of using the clip CLP instead of using the wire W1 and the wire W2, the joint area in the present embodiment by the clip CLP can be made larger than the joint area in the related art by the wire W1 and the wire W2. Therefore, according to the package structure PKG1 of the first embodiment, the on-resistance can be reduced.

Furthermore, the wire W1 and the wire W2 used in the related art are made of aluminum, resulting in a longer current path composed of aluminum having a lower conductivity than copper in the current path. On the other hand, in the first embodiment, a clip CLP made of copper is used instead of the wire W1 or the wire W2. In view of the fact that the conductivity of copper is higher than the conductivity of aluminum, according to the package structure PKG1 of the first embodiment using the clip CLP made of copper, the on-resistance can be reduced.

Method of Manufacturing Package Structure in First Embodiment

Next, a process of assembling the package structure PKG1 (semiconductor device) will be described.

Figure 6:
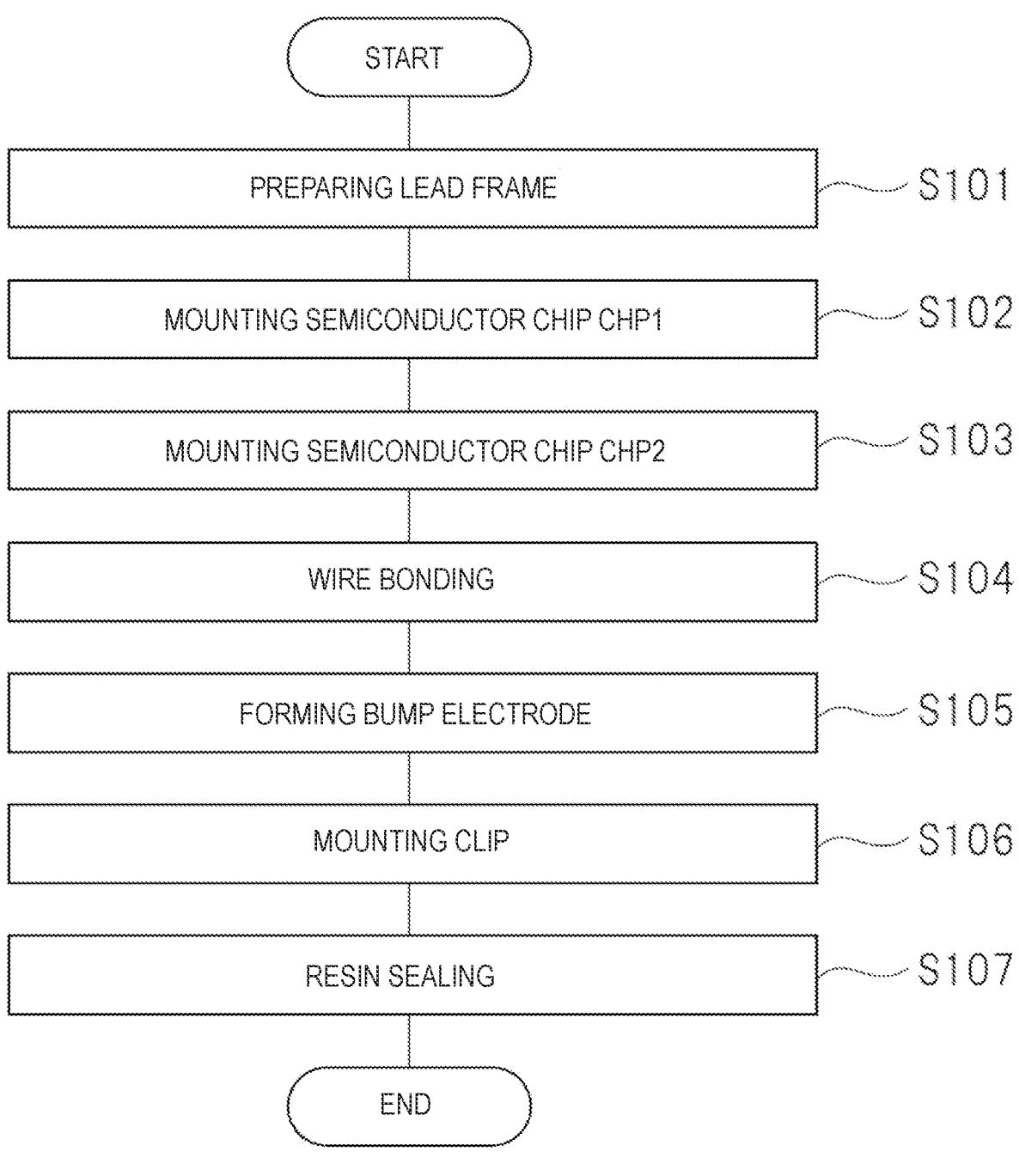
FIG. 6 is a flowchart for explaining an assembly process of the package structure.

FIG. 6 is a flow chart explaining an assembling process of the package structure PKG1.

First, a lead frame having a die pad DP and a lead LD is prepared (S101). Then, by using the die bonding device, the semiconductor-chip CHP1 on which the power transistor is formed is mounted on the die pad DP. Specifically, after the conductive adhesive member 40 made of solder, silver-paste, or the like is applied on the die pad DP, the semiconductor chip CHP1 is mounted on the die pad DP via the conductive adhesive member 40 (S102).

Next, the semiconductor chip CHP2 on which the control circuitry is formed is mounted on the semiconductor chip CHP1 by using the die bonding device. Specifically, after the insulating adhesive is disposed in the third region located between the first region in which the source pad SP1 of the semiconductor chip CHP1 is formed and the second region in which the second source pad of the first semiconductor chip is formed, the second semiconductor chip is mounted on the first semiconductor chip via the insulating adhesive member (S103).

Thereafter, by using the wire bonding device, the pad PD3 formed on the semiconductor chip CHP1 and the pad PD4 formed on the semiconductor chip CHP2 are connected by the wire W3, and the pad PD5 formed on the semiconductor chip CHP2 and the lead LD (lead LD2, lead LD3, lead LD5, lead LD6) are connected by the wire W4 (S104). Then, by using the above-described wire bonding device, the bump electrode BMP1 is formed on the source pad SP1, the bump electrode BMP2 is formed on the source pad SP2, the bump electrode BMP3 is formed on the lead LD1, and the bump electrode BMP4 is formed on the lead LD7 (S105).

Subsequently, by using the die bonding device described above, the clip CLP is arranged such that the clip CLP is arranged above the semiconductor chip CHP2 such that the clip CLP extends across the semiconductor chip CHP2, and the clip CLP is arranged on the source pad SP1, the source pad SP2, the lead LD1 and the lead LD7 via the bump electrode BMP1, the bump electrode BMP2, the bump electrode BMP3, and the bump electrode BMP4, respectively (S106). Thereafter, the sealing member MR is formed by resin-sealing (molding) (S107). Then, plating layers are formed on the outer lead portions of the leads LD exposed from the sealing member MR as needed. Next, outside the sealing body MR, the sealing body MR is separated from the frame casing of the lead frame by cutting the leads LD at a predetermined position. Subsequently, a bending processing is applied to the outer lead portions of the leads LD protruding from the sealing member MR. As described above, the packaging structure PKG1 can be produced.

<Features of Manufacturing Method>

In the manufacturing process of the package structure PKG1 according to the first embodiment, a bump electrode (stud bump electrode) is formed by using a existing wire bonding device used in a wire bonding process (S104). In the first embodiment, a step (S106) of mounting a clip CLP is performed using a existing die bonding device used in a die bonding step (S102) of mounting a semiconductor chip CHP1 on a die pad DP. Furthermore, the lead frame used in the related art can be diverted as it is.

Therefore, in the manufacturing process of the package structure PKG1 according to the first embodiment, equipment such as the existing die bonding device and the wire bonding device can be diverted and the existing lead frame can be diverted, so that the manufacturing cost of the package structure PKG1 can be reduced and the capital expenditure can be minimized.

Second Embodiment

Configuration of Package Structure in Second Embodiment

Figure 7:
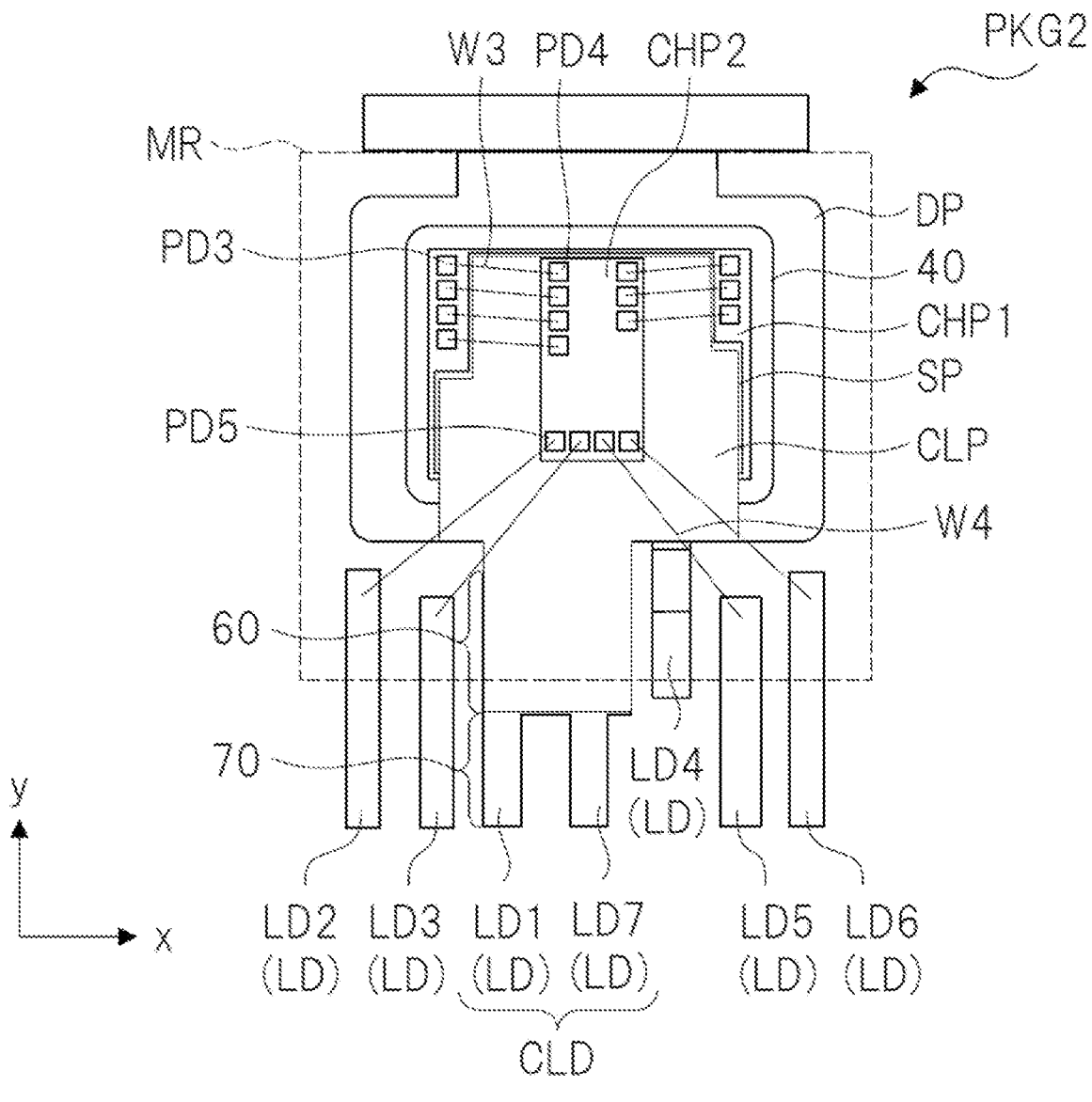
FIG. 7 is a top view of a package structure according to a second embodiment seeing through the sealing body.

FIG. 7 is a top view of a package structure PKG2 seeing through the sealing body MR.

In FIG. 7, in the package structure PKG2 according to the second embodiment, the clip CLP is arranged on the semiconductor chip CHP1 via a conductive adhesive member (not shown), and the semiconductor chip CHP2 is mounted on the clip CLP via an insulating adhesive member (not shown).

Here, the plurality of leads is arranged alongside in the x-direction (first direction). The plurality of leads LD includes a lead LD2, a lead LD3, a lead LD5, and a lead LD6 connected to any of the plurality of pads PD5 of the semiconductor chip CHP2, and the plurality of leads LD also includes a lead LD1 and a lead LD7 that are connected to the clip CLP. The plurality of leads LD also includes a lead LD4 connected to the die pad DP. At this time, the lead LD1 and the lead LD7 connected to the clip CLP are arranged between the lead LD3 and the lead LD5. The lead LD1 and the lead LD7 integrally compose a composite lead CLD. The composite lead CLD includes a post 60 connected to the clip CLP via a conductive adhesive member, and a plurality of extending portions 70 extending from the post 60 in the y-direction. That is, the composite lead CLD includes a post 60 connected to the clip CLP via a conductive adhesive member, a lead LD1 (first lead) connected to the post 60, and a lead LD7 (fifth lead) connected to the post 60.

Features in Second Embodiment

A feature of the second embodiment is that, for example, as shown in FIG. 7, a clip CLP is mounted on a source pad SP formed on a semiconductor chip CHP1 via a conductive adhesive member, and a semiconductor chip CHP2 is mounted on the clip CLP via an insulating adhesive member. Accordingly, the on-resistance of the package structure PKG2 can be reduced.

This is because, according to the second embodiment, the source pad SP is formed on substantially the entire front surface of the semiconductor chip CHP1, and the source pad SP and the clip CLP are jointed to each other, so that the joint area between the source pad SP and the clip CLP can be increased. That is, if the joint area between the source pad SP and the clip CLP can be increased, the on-resistance in the clip CLP can be reduced.

Further, since the large-area post 60 and the clip CLP are jointed together by integrating the lead LD1 and the lead LD7 connected to the clip CLP, the joint area between the post 60 and the clip CLP can also be increased. Consequently, according to the package structure PKG2 of the second embodiment, the on-resistance can be reduced.

Further, according to the second embodiment, the surface potential gradient profile on the front surface of the semiconductor-chip CHP1 can be reduced. From this also, it is possible to reduce the on-resistance of the packaged structure PKG2. This point will be described below.

For example, in the related art shown in FIG. 2B, since the semiconductor chip CHP2 is directly mounted on the semiconductor chip CHP1, the source pad SP1 and the source pad SP2 formed on the semiconductor chip CHP1 need to be formed so as not to overlap with the semiconductor chip CHP2 to be mounted. Therefore, as shown in FIG. 2B, the source pad SP1 and the source pad SP2 are smaller in sizes in the entire front surface of the semiconductor-chip CHP1. The reduction in the size of the source pad SP1 and the size of the source pad SP2 means that the area where the source pad SP1 and the source pad SP2 are not formed in the front surface area of the semiconductor chip CHP1 increases, and the parasitic resistivity from the source pad SP1 and the source pad SP2 to this area increases. That is, in the related art, the surface-potential gradient increases due to an increase in the area of the regions where the source pad SP1 and the source pad SP2 are not formed. When such a surface potential gradient increases, the on-resistance of the path of the back surface (drain) of the semiconductor chip CHP1→the thickness of the semiconductor chip CHP1

(power transistor)→the front surface of the semiconductor chip CHP1→the source pad SP1 and the source pad SP2 increases. In particular, an increase in the surface potential gradient means an increase in the parasitic resistivity in the path of the front surface of the semiconductor-chip CHP1→the source pad SP1 and the source pad SP2.

On the other hand, in the second embodiment shown in FIG. 7, the source pad SP is formed on substantially the entire front surface of the semiconductor chip CHP1, and the source pad SP and the clip CLP are jointed to each other, and the semiconductor chip CHP2 is mounted on the clip CLP via an insulating adhesive member.

Therefore, according to the second embodiment, the joint area between the source pad SP and the clip CLP can be increased even though the semiconductor chip CHP2 is mounted. That is, in the second embodiment, the area of the region that is not jointed to the clip CLP made of copper with high conductivity in the front surface region of the semiconductor chip CH1 can be reduced, and thus the surface potential gradient can be reduced. Therefore, according to the second embodiment, the on-resistance can be reduced.

First Modified Example of Second Embodiment

Figure 8:
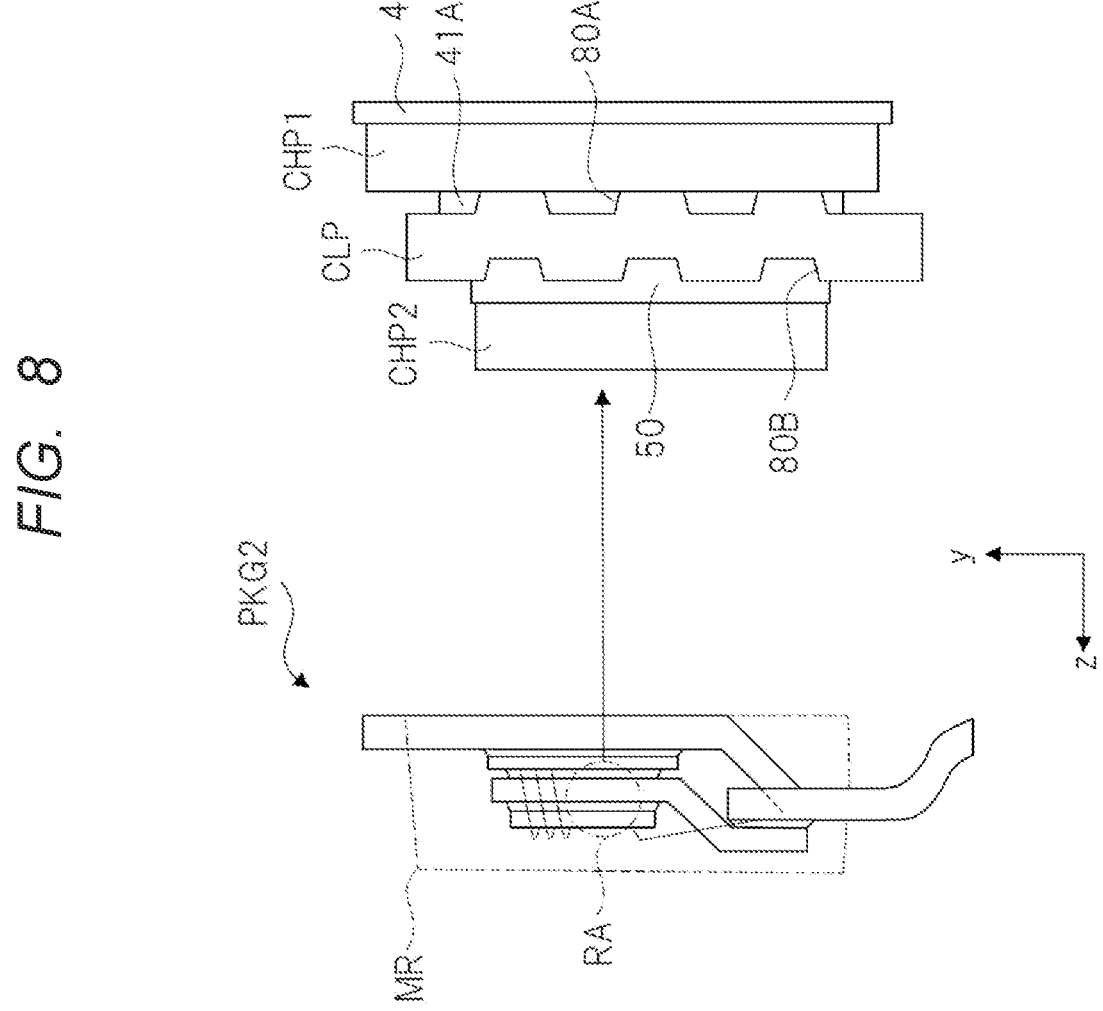
FIG. 8 is a side view of the package structure in Modified Example 1 of the second embodiment seeing through the sealing body in which a partial region is enlarged.

FIG. 8 is a side view of the package structure PKG2 seeing through the sealing body MR, showing the region RA in an enlarged manner.

In FIG. 8, a semiconductor chip CHP1 is mounted on a conductive adhesive member 40, and a clip CLP is mounted on the semiconductor chip CHP1 via a conductive adhesive member 41A. A semiconductor-chip CHP2 is mounted on the clip CLP via an insulating adhesive member 50.

Here, as shown in FIG. 8, an unevenness shape 80A is formed in the lower surface of the clip CLP. Thus, according to the first modified example, it is possible to secure the positional stability (arrangement stability) when the clip CLP is mounted on the semiconductor chip CHP1. Similarly, in the first modified example, an unevenness shape 80B is also formed in the upper surface of the clip CLP. Accordingly, it is possible to secure the positional stability (arrangement stability) when the semiconductor chip CHP2 is mounted on the clip CLP. That is, according to the first modified example, the bonding stability (mounting stability) of the clip CLP and the mounting stability of the semiconductor chip CHP2 can be concurrently achieved by forming the unevenness shape 80A in the lower surface of the clip CLP and also forming the unevenness shape 80B in the upper surface of the clip CLP.

Second Modified Example of Second Embodiment

Figure 9A:
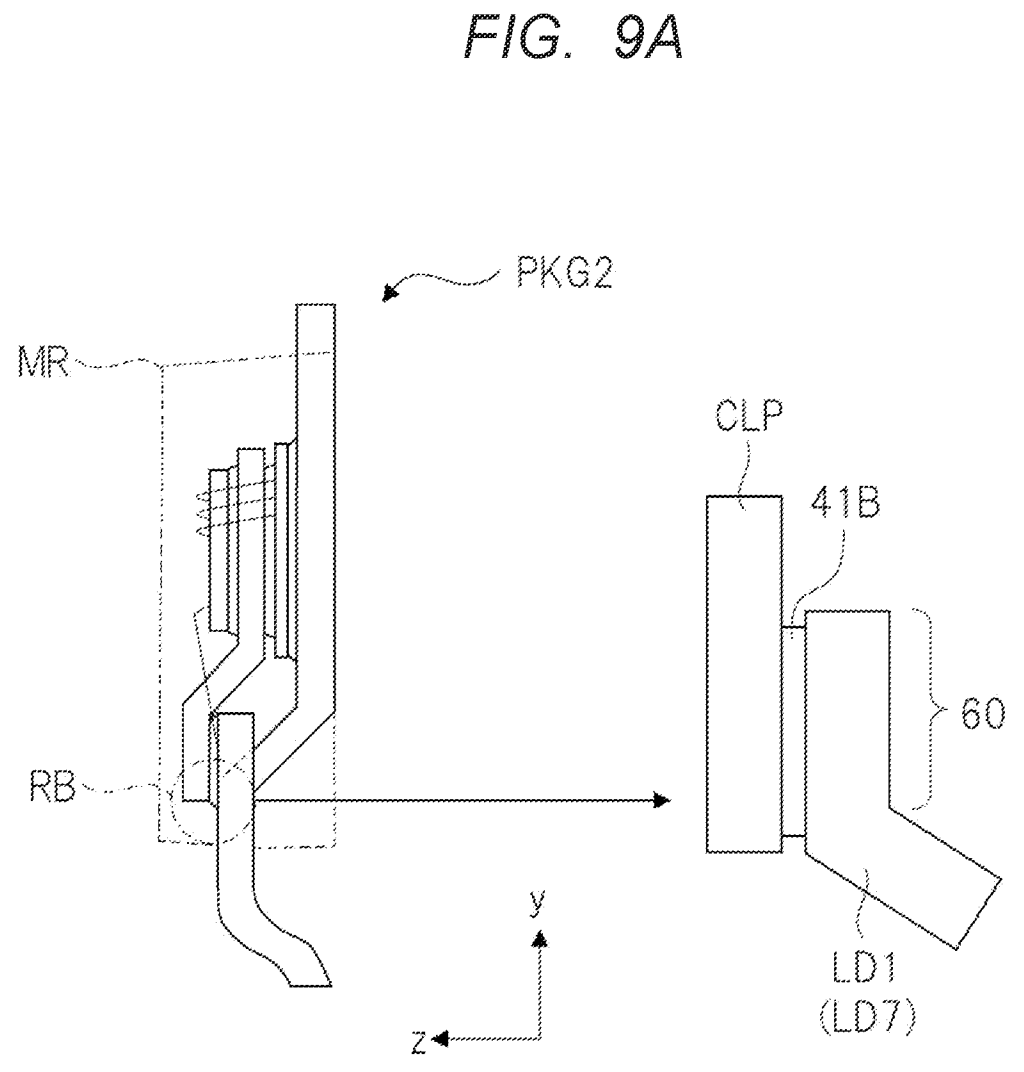
Figure 9B:
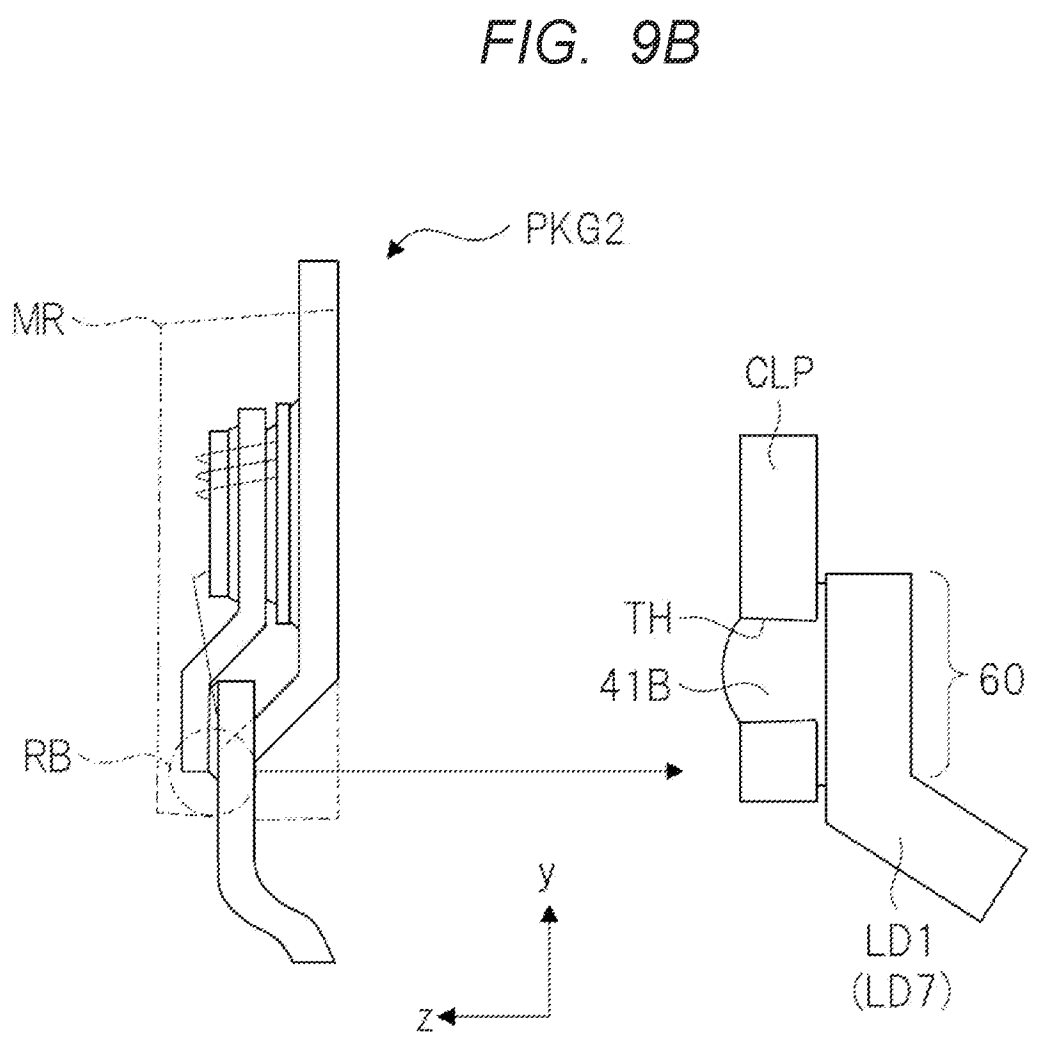
Figure 9C:
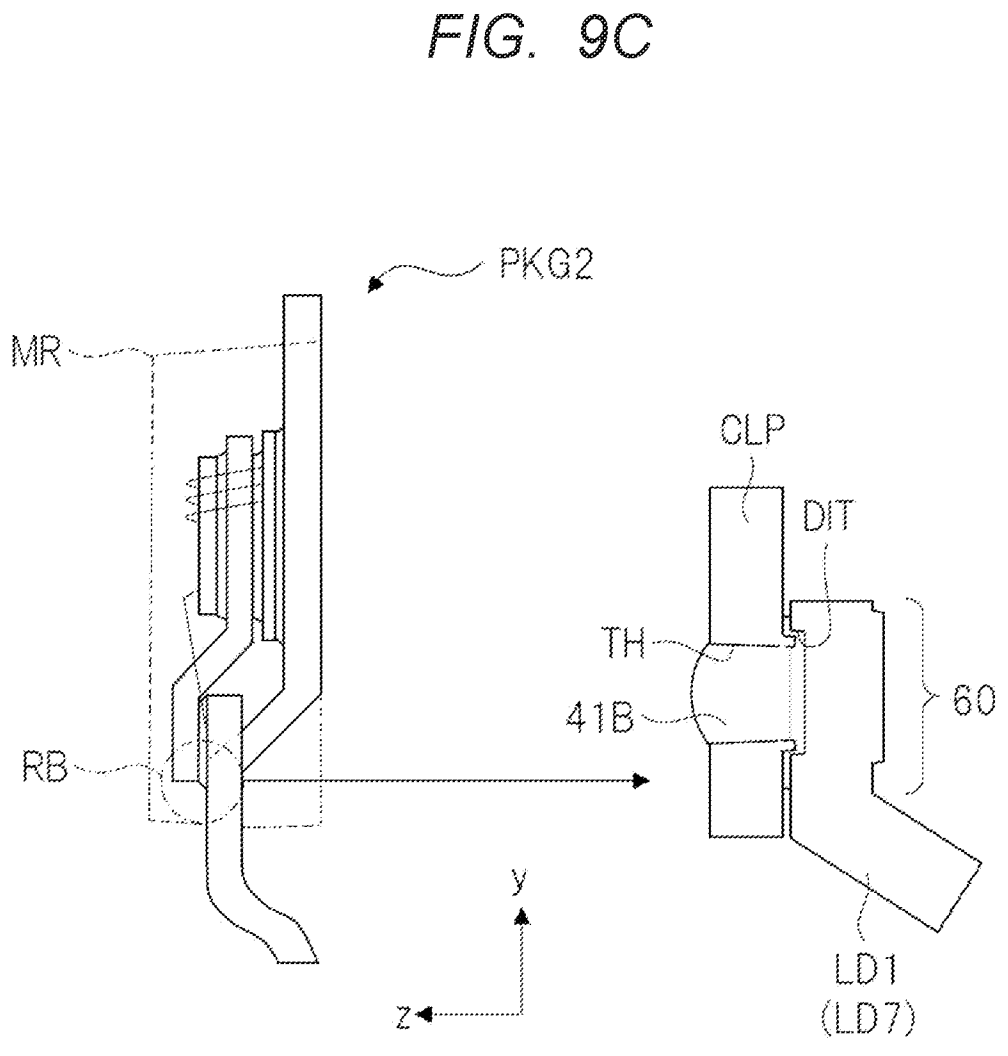

FIGS. 9A to 9C are side views of the package structure PKG2 seeing through the sealing body MR, showing the region RB in an enlarged manner.

In FIG. 9A, the lead LD1 (lead LD7) includes a post 60, and the post 60 and the clip CLP are connected to each other via a conductive adhesive member 41B.

FIG. 9B is a diagram showing another connecting structure of the clip CLP and the post 60 according to the second modified example, which differs from FIG. 9A. As shown in FIG. 9B, the clip CLP has a through hole TH formed therein, and the clip CLP is connected to the lead LD1 (lead LD7) such that the through hole TH overlapping with the post 60 is filled with the conductive adhesive member 41B. Thus, according to the second modified example, the thickness of the conductive adhesive member 41B with which the through hole TH formed in the clip CLP is filled can be increased, thereby improving the reliability of connecting of the clip CLP and the lead LD1 (lead LD7) via the conductive adhesive member 41B.

Further, FIG. 9C is a diagram showing yet another connecting structure of the clip CLP and the post 60 in the second modified example, differently from FIG. 9A and FIG. 9B. As shown in FIG. 9C, a through hole TH is formed in the clip CLP, and a trench DIT is formed in the post 60. Then, the clip CLP is arranged in the post 60 so that the through hole TH is arranged inside the trench DIT. The clip CLP is connected to the lead LD1 (lead LD7) so that the through hole TH arranged inside the trench DIT is filled with the conductive adhesive member 41B. In this case, not only the thickness of the conductive adhesive member 41B with which the through hole TH formed in the clip CLP is filled is increased, but also the connection strength between the clip CLP and the post 60 is improved since the through hole TH is arranged inside the trench DIT, and consequently, the connection reliability between the clip CLP and the lead LD1 (lead LD7) via the conductive adhesive member 41B can be further improved.

Third Modified Example of Second Embodiment

Figure 10:
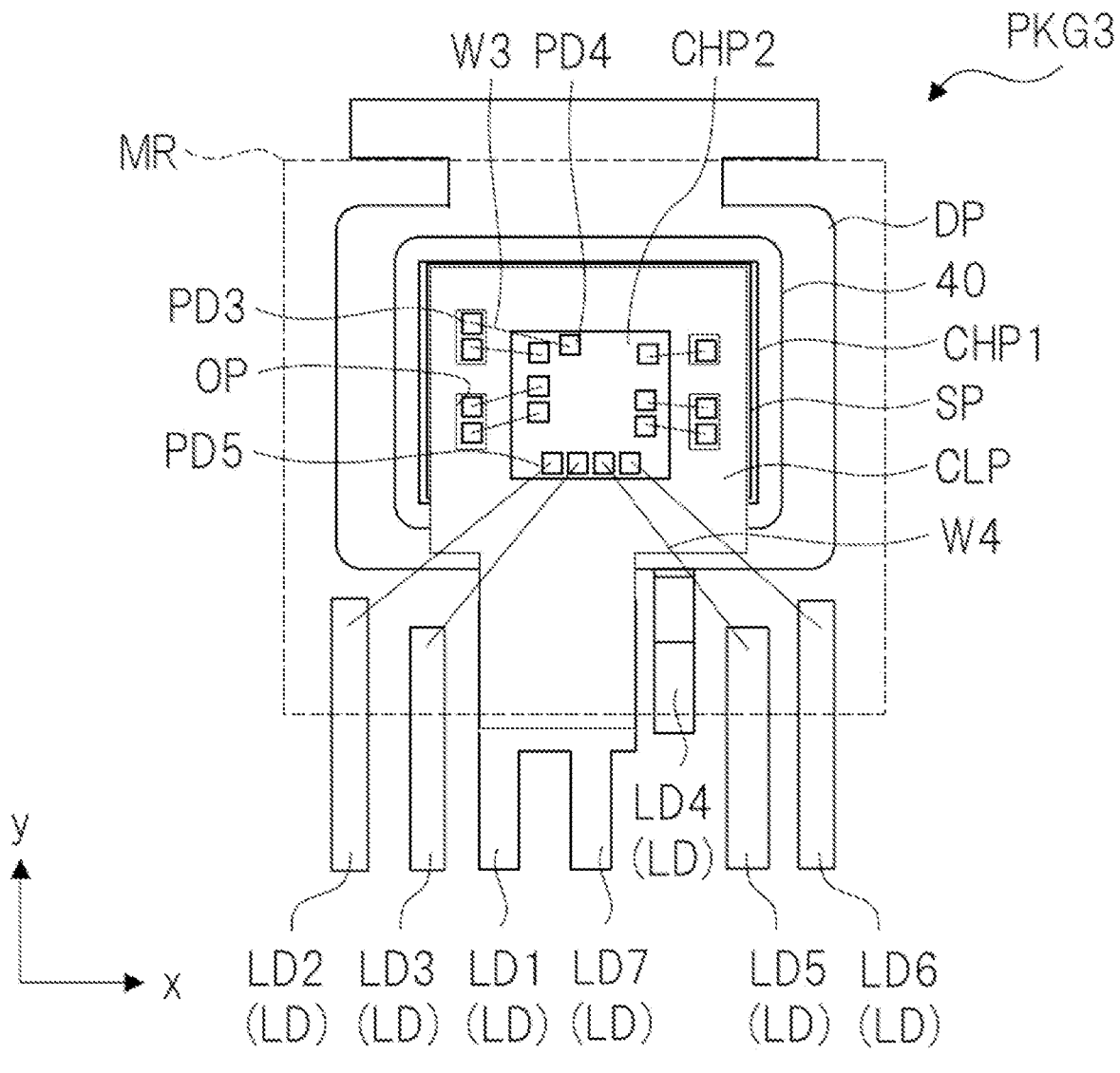
FIG. 10 is a top view of a package structure in Modified Example 3 of the second embodiment seeing through the sealing body.

FIG. 10 is a top view of a package structure PKG3 seeing through the sealing body MR. In FIG. 10, in the package structure PKG3 according to the third modified example, a plurality of openings OP is provided in the clip CLP. A pad PD3 (third pad) is formed in the front surface of the semiconductor chip CHP1 exposed from each of the plurality of openings OP. On the other hand, a plurality of pads PD4 (fourth pads) are formed on the front surface of the semiconductor chip CHP2 mounted on the clip CLP via an insulating adhesive member, and the pad PD3 and the pad PD4 are connected by a wire W3. According to the package structure PKG3 of the third modified example configured as described above, by appropriately adjusting the layout of the opening OP, the planar shape of the clip CLP can be optimized so that the surface potential gradient on the front surface of the semiconductor chip CHP becomes small.

Fourth Modified Example of Second Embodiment

Figure 11A:
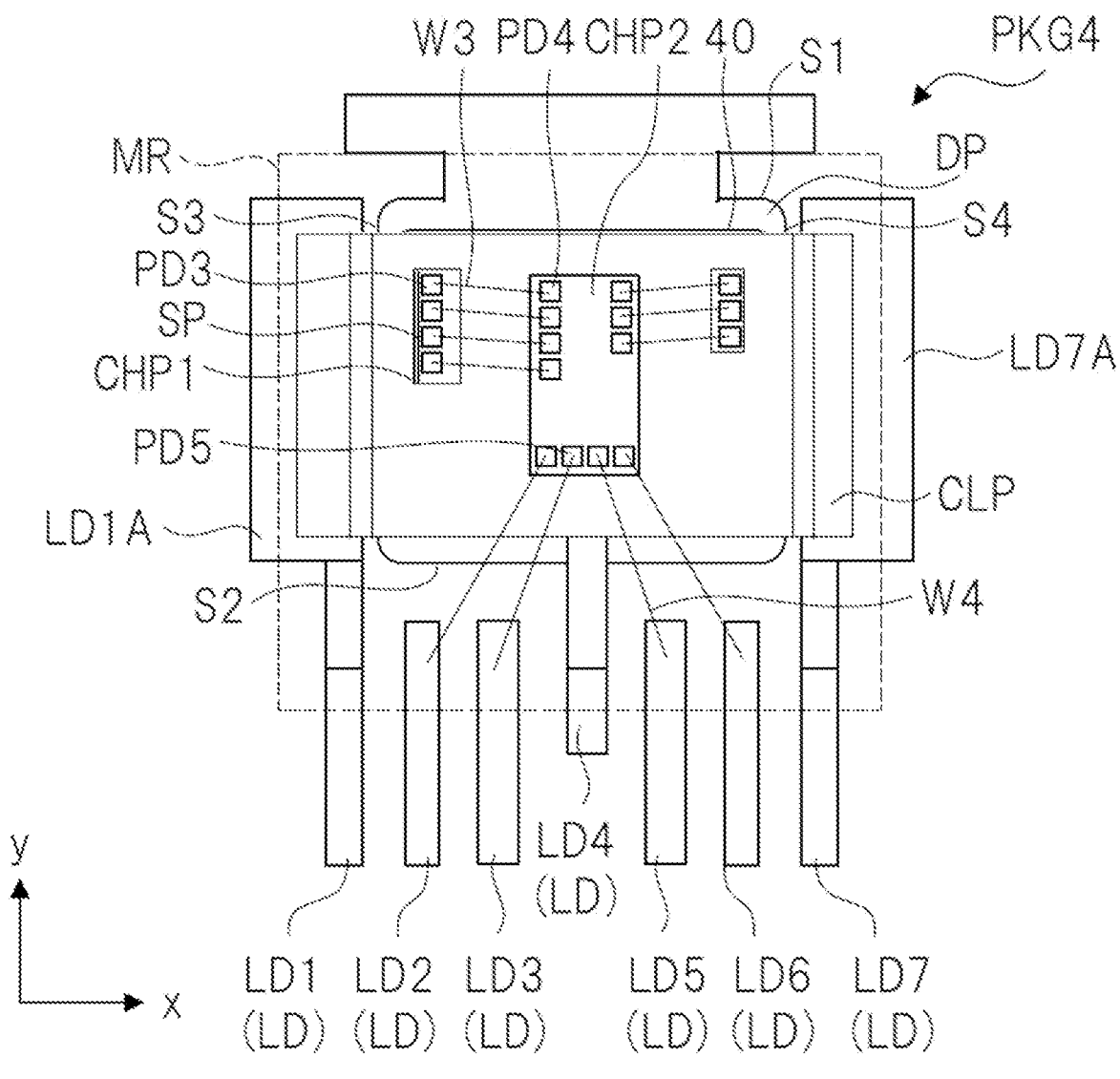
FIG. 11A is a top view of a package structure in Modified Example 4 of the second embodiment seeing through the sealing body.
Figure 11B:
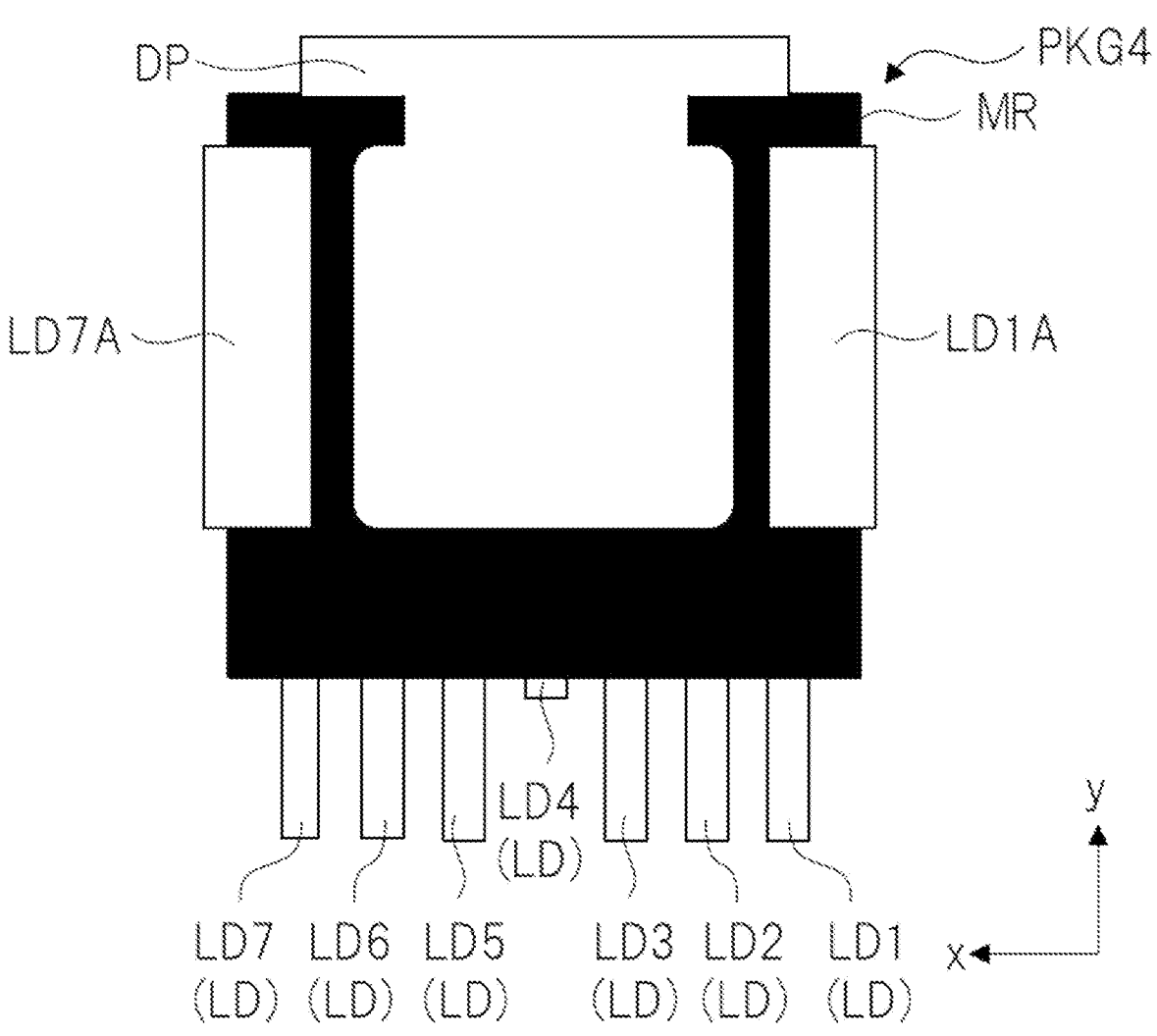
FIG. 11B is a bottom view of the package structure in Modified Example 4 of the second embodiment.

FIGS. 11A to 11B are diagrams showing the configuration of a package structure PKG4. In particular, FIG. 11A is a top view of the package structure PKG4 seeing through the sealing body MR, and FIG. 11B is a bottom view of the package structure PKG4.

In FIG. 11A, the die pad DP has a first side S1 extending in the x-direction, a second side S2 facing the first side, a third side S3 intersecting with the first side S1 and the second side S2, and a fourth side S4 facing the third side S3. The plurality of leads LD are arranged alongside in the x-direction. At this time, in FIG. 11A, among the plurality of leads LD extending in the y-direction, the lengths of the lead LD1 and the lead LD7 are longer than the lengths of other leads LD2 to LD6, respectively. Then, as shown in FIG. 11A, the lead LD1 is provided along the third side S3 of the die pad DP so that a portion (edge portion) LD1A of the lead LD1 is located next to the die pad DP. That is, the lead LD1 (first lead) is arranged along the third side S3 of the die pad DP. Here, as shown in FIG. 11A, the width (width in the x-direction) of a portion LD1A of the lead LD1, which is located adjacent to the die pad DP, is larger than the width (width in the x-direction) of the remaining portion of the lead LD1.

Similarly, in FIG. 11A, the lead LD7 is provided along the fourth side S4 of the die pad DP such that a portion (edge portion) LD7A of the lead LD7 is located next to the die pad DP. That is, the lead LD7 (sixth lead) is arranged along the fourth side S4 of the die pad DP. Here, as shown in FIG. 11A, the width (width in the x-direction) of a portion LD7A of the lead LD7, which is located adjacent to the die pad DP, is larger than the width (width in the x-direction) of the remaining portion of the lead LD7.

In this way, the die pad DP is located between a portion (edge portion) LD1A of the lead LD1 and a portion (edge portion) LD7A of the lead LD7 in plan view.

The clip CLP has a rectangular shape extending in the x-direction, is connected to the lead LD1 via a conductive adhesive member (not shown), and is connected to the lead LD7 via a conductive adhesive member (not shown). Specifically, as shown in FIG. 11A, the clip CLP is connected to a portion LD1A of the lead LD1 and is connected to a portion LD7A of the lead LD7. As described above, the width (width in the x-direction) of a portion LD1A of the lead LD1 connected to the clip CLP is larger than the width (width in the x-direction) of the remaining portion of the lead LD1. In addition, the width (width in the x-direction) of a portion LD7A of the lead LD7 connected to the clip CLP is larger than the width (width in the x-direction) of the remaining portion of the lead LD7.

Accordingly, it is possible to increase the joint area between the clip CLP and the lead LD1 and the joint area between the clip CLP and the lead LD7, thereby improving the connection reliability between the lead LD1 and the clip CLP and the connection reliability between the lead LD7 and the clip CLP. According to the package structure PKG4 of the fourth modified example configured as described above, the joint area of the joint portion of the lead LD1 (lead LD7) and the clip CLP can be increased, so that the on-resistance at the joint portion of the lead LD1 (lead LD7) and the clip CLP can be reduced.

Further, as shown in FIG. 11B, a portion LD1A of the lead LD1 and a portion LD7A of the lead LD7 are exposed from the sealing body MR. Accordingly, the heat dissipation property at the joint portion of the lead LD1 (lead LD7) and the clip CLP can be improved.

Method of Manufacturing Package Structure in Second Embodiment

Next, a process of assembling the package structure PKG2 will be described.

Figure 12:
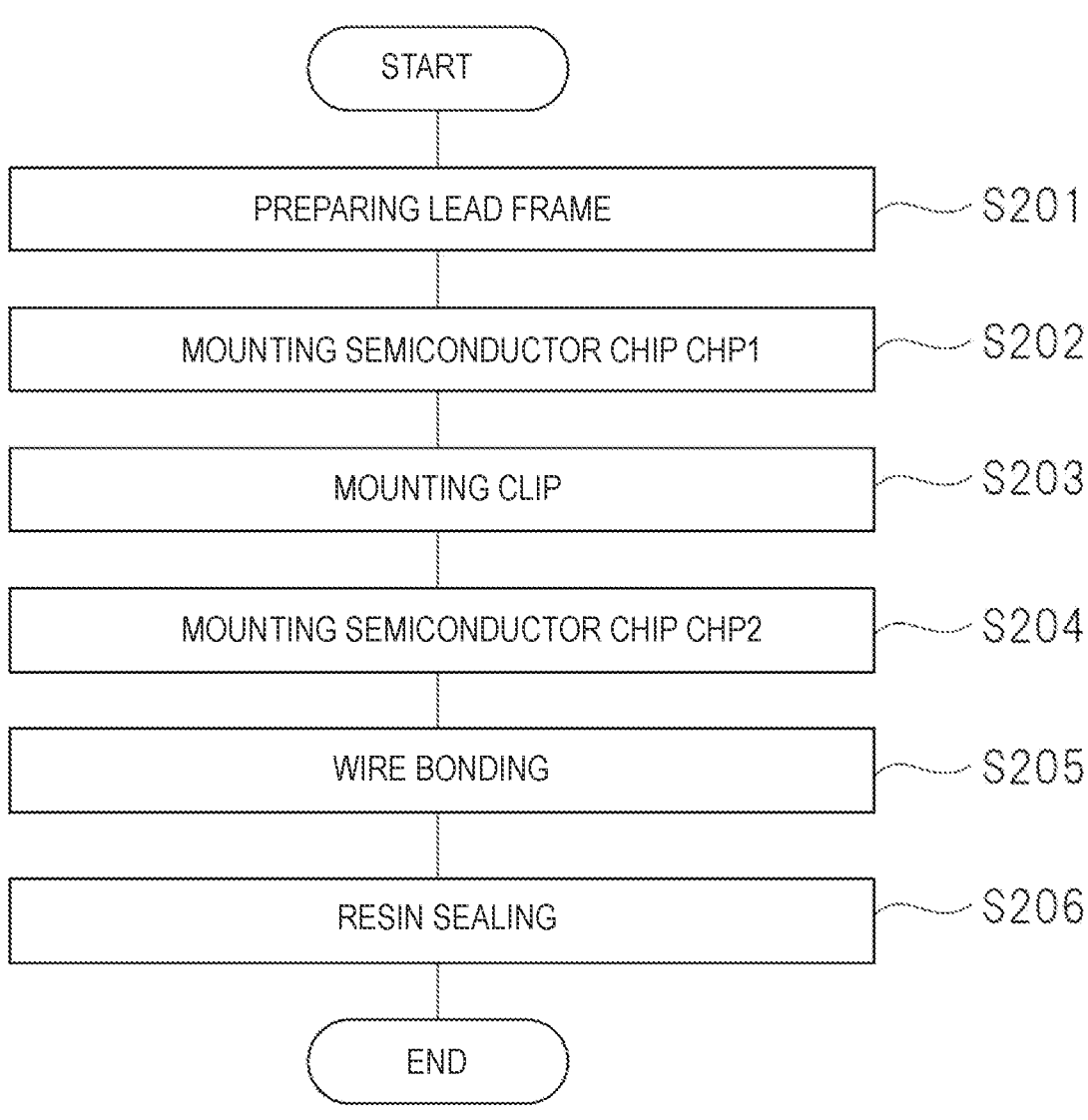
FIG. 12 is a flowchart for explaining an assembly process of the package structure.

FIG. 12 is a flow chart explaining a process of assembling the package structure PKG2.

First, a lead frame having a die pad DP and a lead LD is prepared (S201). Then, the semiconductor chip CHP1 in which the power transistor is formed is mounted on the die pad DP. Specifically, after the conductive adhesive member 40 made of solder, silver-paste, or the like is applied on the die pad DP, the semiconductor chip CHP1 is mounted on the die pad DP via the conductive adhesive member 40 (S202).

Next, after the clip CLP is mounted on the semiconductor chip CHP1 (S203), the semiconductor chip CHP2 in which the control circuit is formed is mounted on the clip CLP (S204). Thereafter, the pad PD3 formed on the semiconductor chip CHP1 and the pad PD4 formed on the semiconductor chip CHP2 are connected by a wire W3, and the pad PD5 formed on the semiconductor chip CHP2 and the lead LD (lead LD2, lead LD3, lead LD5, lead LD6) are connected by a wire W4 (S205).

Subsequently, the sealing member MR is formed by resin-sealing (molding) (S206). Then, plating layers are formed on the outer lead portions of the leads LD exposed from the sealing member MR as needed. Next, outside the sealing body MR, the sealing body MR is separated from the frame casing of the lead frame by cutting the leads LD at a predetermined position. Subsequently, a bending processing is applied to the outer lead portions of the leads LD protruding from the sealing member MR. As described above, the packaging structure PKG2 can be produced.

Third Embodiment

Configuration of Package Structure in Third Embodiment

Figure 13:
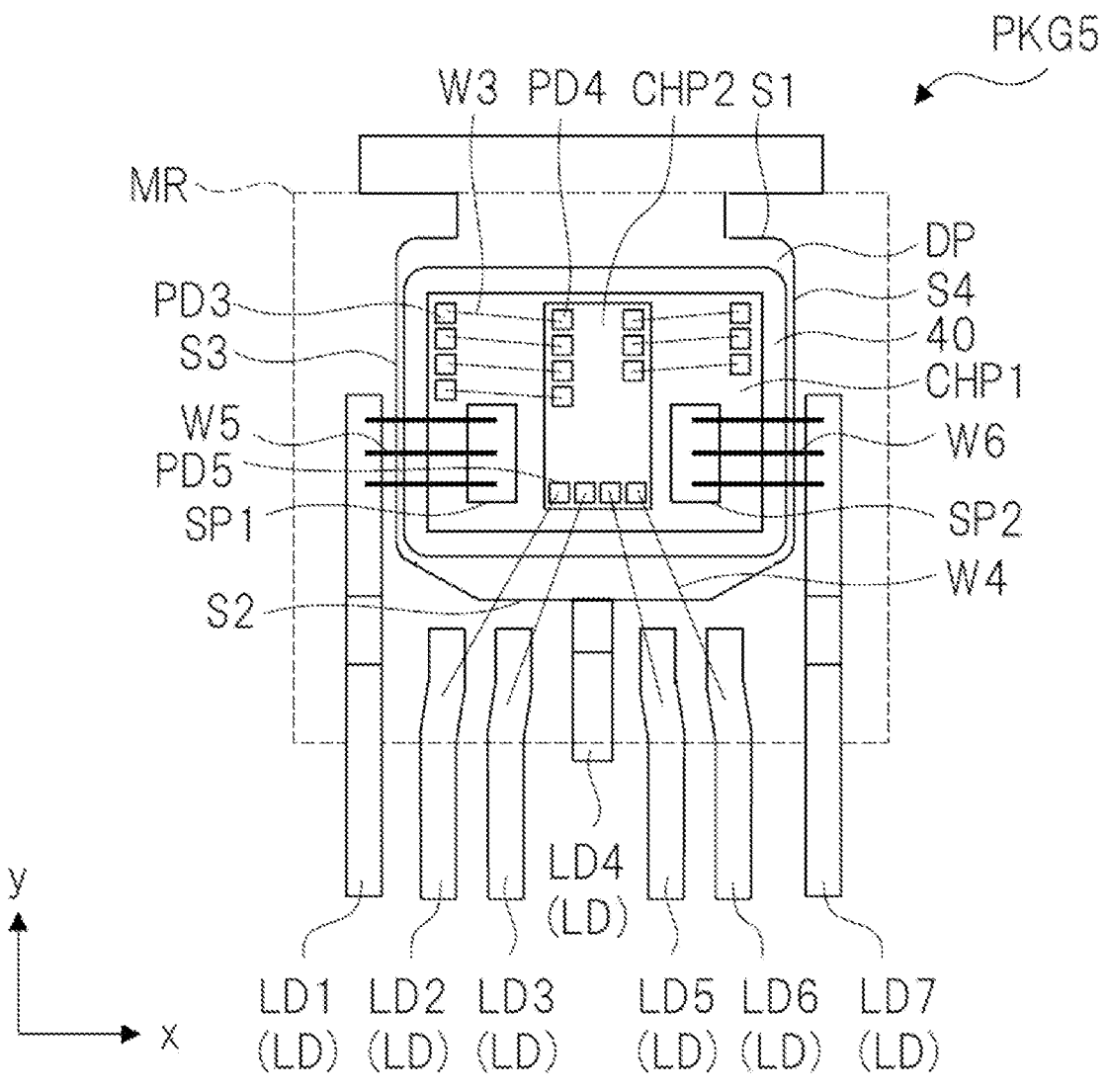
FIG. 13 is a top view of a package structure according to a third embodiment seeing through the sealing body.

FIG. 13 is a top view of a package structure PKG5 seeing through the sealing body MR.

In FIG. 13, the package structure PKG5 according to the third embodiment includes a semiconductor chip CHP1 in which a power transistor is formed, a semiconductor chip CHP2 in which a control circuit for controlling the power transistor is formed, a die pad DP on which the semiconductor chip CHP1 is mounted, and a plurality of leads LD arranged alongside in the x-di recti on.

Here, the die pad DP has a first side S1 extending in the x-direction, a second side S2 facing the first side S1, a third side S3 intersecting with the first side S1 and the second side S2, and a fourth side S4 facing the third side S3. The semiconductor chip CHP1 has a front surface, and the front surface includes a first region in which the source pad SP1 is formed, a second region in which the source pad SP2 is formed, and a third region located between the first region and the second region in plan view.

The semiconductor chip CHP2 is arranged on the third region via an insulating adhesive member. Further, the plurality of leads LD has a lead LD1 extending along the third side S3 and a lead LD7 extending along the fourth side S4, and the die pad DP is arranged between the lead LD1 and the lead LD7 planarly. At this time, the source pad SP1 is connected to the lead LD1 via a plurality of wires W5, and the source pad SP2 is connected to the lead LD7 via a plurality of wires W6. In this way, the package structure PKG5 according to the third embodiment is configured.

To summarize the above, the configuration of the package structure PKG5 in the third embodiment is as follows. That is, the semiconductor device as the package structure PKG5 includes a semiconductor chip CHP1 in which a power transistor is formed, a semiconductor chip CHP2 in which a control circuit for controlling the power transistor is formed, a plurality of bonding wires (wire W3, wire W5, wire W6) electrically connected to the power transistor, a die pad DP on which the semiconductor chip CHP1 is mounted, and a plurality of leads LD electrically connected to the plurality of bonding wires, respectively.

Here, the die pad DP has a first side S1 extending in the first direction (x direction), a second side S2 facing the first side S1, a third side S3 intersecting with the first side S1 and the second side S2, and a fourth side S4 facing the third side S3.

The plurality of leads LD are arranged alongside in the first direction (x direction), and the plurality of leads LD have a first lead (lead LD1) extending along the third side S3 and a second lead (lead LD7) extending along the fourth side S4. At this time, the first lead (lead LD1) extends to a position adjacent to the third side S1, and the second lead (lead LD7) extends to a position adjacent to the fourth side S4.

The plurality of bonding wires includes a first bonding wire (wire W5) electrically connected to the first lead (lead LD1) and a second bonding wire (wire W6) electrically connected to the second lead (lead LD7).

The joint portion of the first bonding wire (wire W5) and the first lead (lead LD1) is located at a position adjacent to the third side S3, and the joint portion of the second bonding wire (wire W6) and the second lead (lead LD7) is located at a position adjacent to the fourth side S4. As described above, the package structure PKG5 is implemented and configured.

Features in Third Embodiment

Next, the feature points in the third embodiment will be described.

As shown in FIG. 13, a characteristic point of the third embodiment is, on the premise that the lead LD1 and the lead LD7 are extended in the y-direction and the die pad PD is arranged such that it is located between the lead LD1 and the lead LD7 in plan view, that the source pad SP1 formed in the semiconductor chip CHP1 and the lead LD1 are connected by a plurality of wires W5 and the source pad SP2 formed in the semiconductor chip CHP1 and the lead LD7 are connected by a plurality of wires W6, for example.

In other words, the lead LD1 extends to a position adjacent to the third side S3, and the joint portion of the wire W5 and the lead LD1 is located at a position adjacent to the third side S3. Further, the lead LD7 extends to a position adjacent to the fourth side S4, and the joint portion of the wire W6 and the lead LD7 is located at a position adjacent to the fourth side S4. Accordingly, the on-resistance of the package structure PKG5 can be reduced. The reason for this will be described below.

First, as a first factor, the lead LD1 and the lead LD7 are extended in the y-direction so that the die pad DP is located between the lead LD1 and the lead LD7 in plan view. That is, the lead LD1 and the lead LD7 are made of copper having a higher conductivity. For this reason, for example, the length of the wire made of aluminum can be made shorter than in the related art shown in FIG. 2B. That is, in the third embodiment, by extending the lead LD1 and the lead LD7 made of copper having higher conductivity than aluminum in the y-direction, the wire length of the wire W5 connecting the lead LD1 and the source pad SP1 and the wire length of the wire W6 connecting the lead LD7 and the source pad SP2 can be shortened. This means that the effects of the wire W5 and the wire W6, which are the main factors in increasing of the on-resistance, can be reduced, which in turn can reduce the on-resistance.

As described above, in the third embodiment, a characteristic point is that, in order to shorten the lengths of the wire W5 and the wire W6 made of aluminum as much as possible, the lead LD1 and the lead LD7 made of copper having higher conductivity than aluminum extend in the y-direction. In particular, from the viewpoint of shortening the length of the wire W5 and the wire W6, it is desirable to arrange the wire W5 so as to be orthogonal to the third side S3, and to arrange the wire W6 so as to be orthogonal to the fourth side S4.

Subsequently, as a second factor, the lead LD1 and the source pad SP1 are connected not by a single wire W5 but by a plurality of wires W5, and the lead LD7 and the source pad SP2 are connected by a plurality of wires W6 instead of a single wire W6. Thus, the on-resistance can be reduced. As described above, according to the third embodiment, the on-resistance can be reduced by the synergistic effect of the first factor and the second factor described above.

Method of Manufacturing Package Structure in Embodiment 3

Next, a process of assembling the package structure PKG5 will be described.

Figure 14:
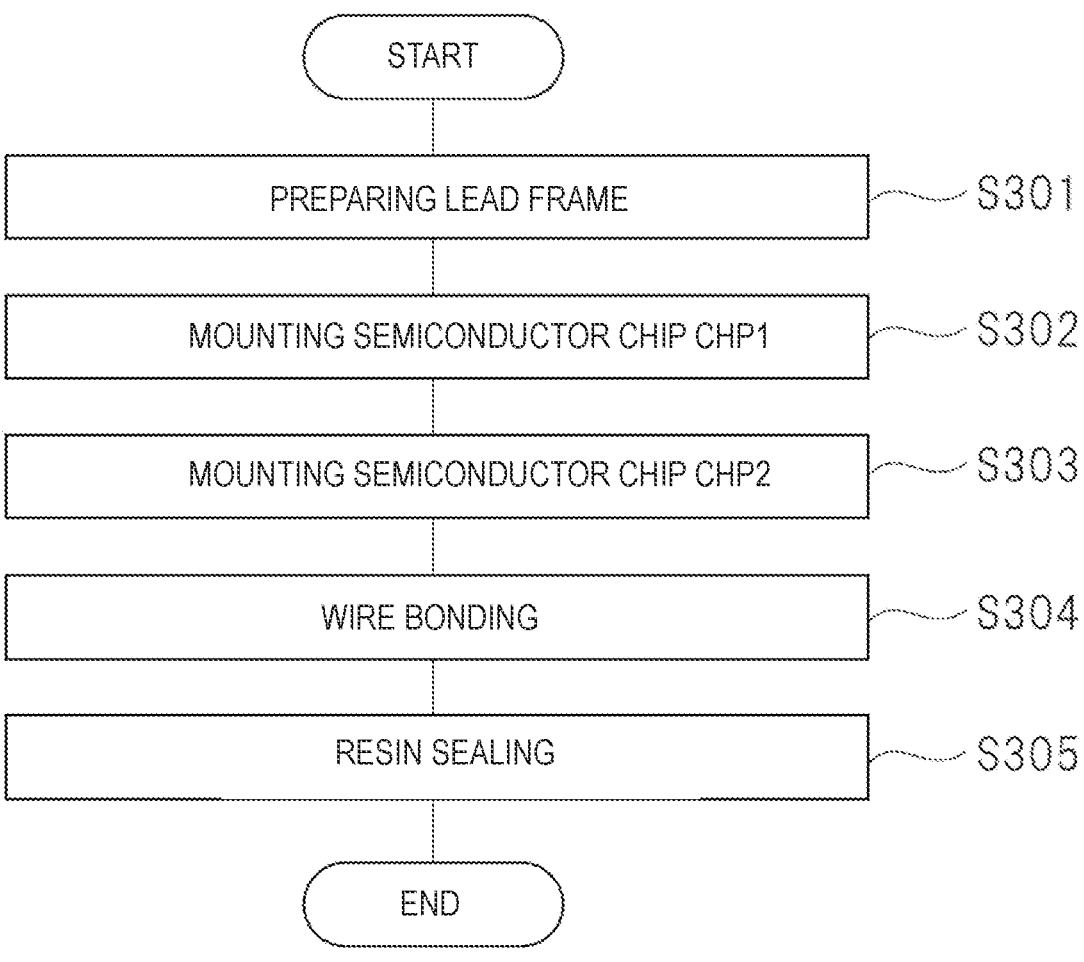
FIG. 14 is a flowchart for explaining an assembly process of the package structure.

FIG. 14 is a flow chart explaining a process of assembling the package structure PKG5.

First, a lead frame having a die pad DP and a lead LD is prepared (S301). Then, the semiconductor chip CHP1 in which the power transistor is formed is mounted on the die pad DP. Specifically, after the conductive adhesive member 40 made of solder, silver-paste, or the like is applied on the die pad DP, the semiconductor chip CHP1 is mounted on the die pad DP via the conductive adhesive member 40 (S302).

Next, the semiconductor chip CHP2 in which the control circuit is formed is mounted on the semiconductor chip CHP1 (S303). Thereafter, the pad PD3 formed in the semiconductor chip CHP1 and the pad PD4 formed in the semiconductor chip CHP2 are connected by a wire W3, and the pad PD5 formed in the semiconductor chip CHP2 and the lead LD (lead LD2, lead LD3, lead LD5, lead LD6) are connected by a wire W4 (S304).

Subsequently, the sealing member MR is formed by resin-sealing (molding) (S305). Then, plating layers are formed on the outer lead portions of the leads LD exposed from the sealing member MR as needed. Next, outside the sealing body MR, the sealing body MR is separated from the frame casing of the lead frame by cutting the leads LD at a predetermined position. Subsequently, bending processing is applied to the outer lead portion of the lead LD protruding from the sealing member MR. As described above, the packaging structure PKG5 can be produced.

Fourth Embodiment

Configuration of Package Structure in Fourth Embodiment

Figure 15A:
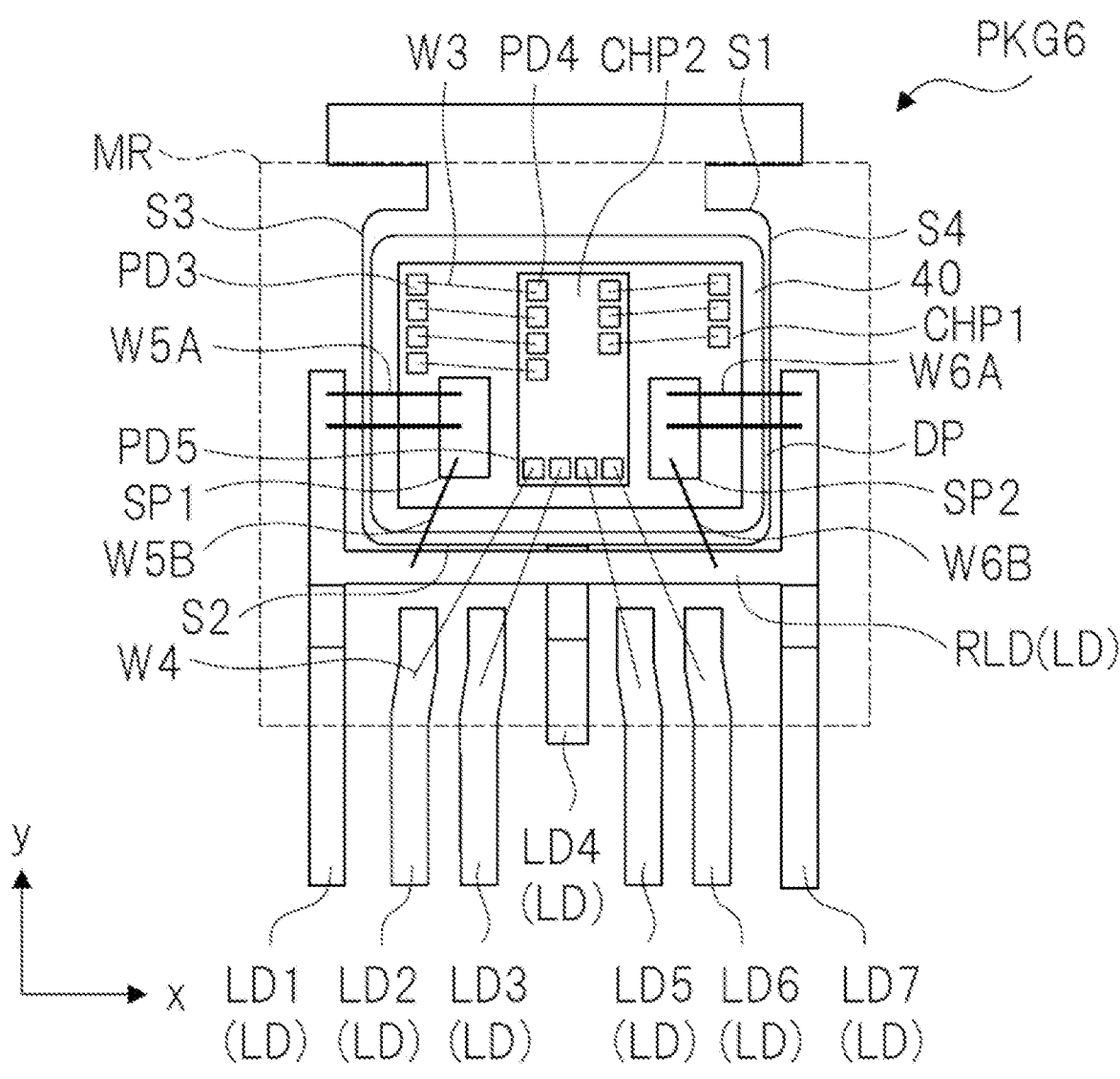
FIG. 15A is a top view of a package structure according to a fourth embodiment seeing through the sealing body.
Figure 15B:
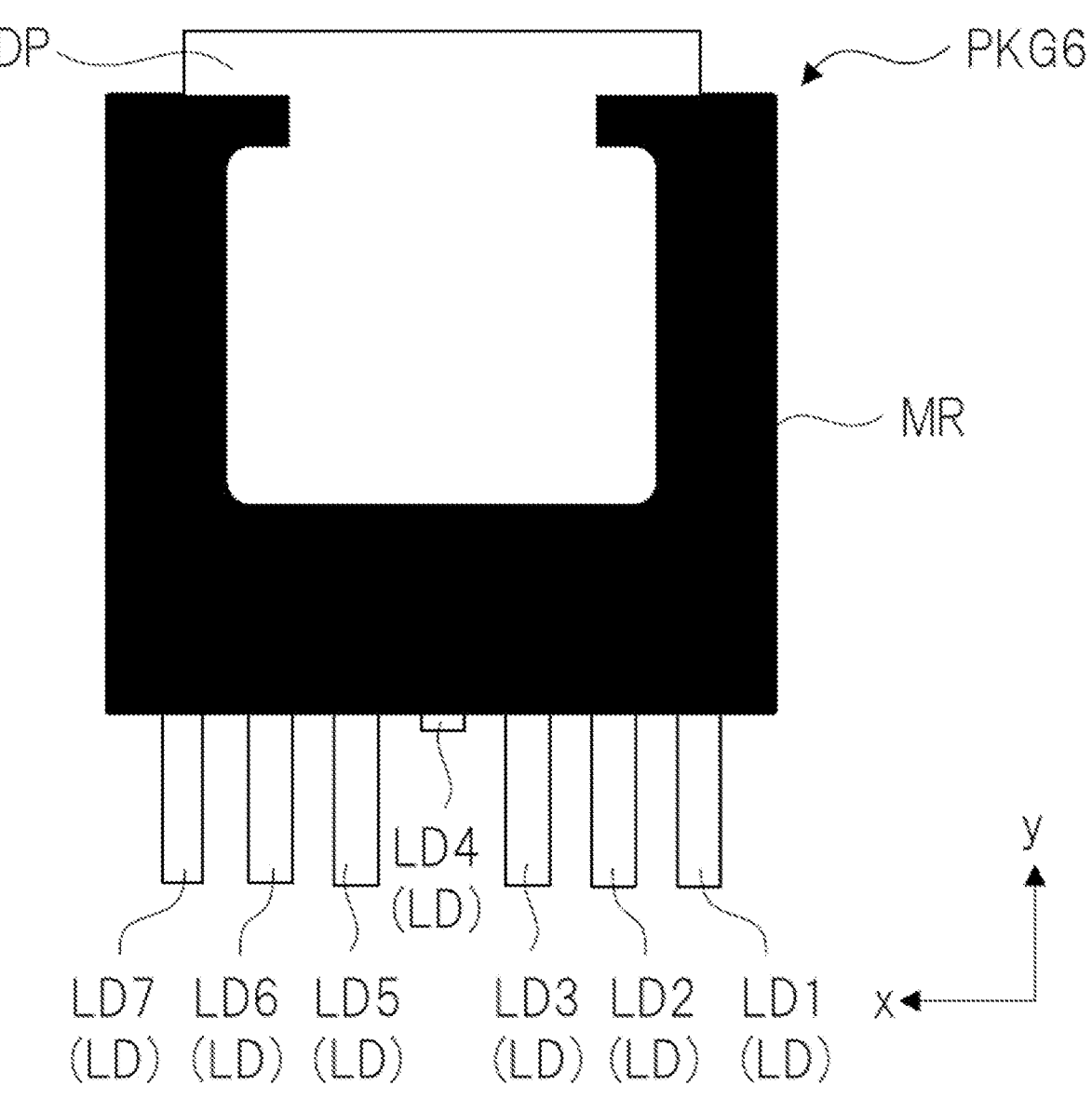
FIG. 15B is a bottom view of the package structure of the fourth embodiment.

FIG. 15A is a top view of a package structure PKG6 seeing through the sealing body MR, and FIG. 15B is a bottom view of the package structure PKG6.

In FIG. 15A, the package structure PKG6 according to the fourth embodiment includes a semiconductor chip CHP1 in which a power transistor is formed, a semiconductor chip CHP2 in which a control circuit for controlling the power transistor is formed, a die pad DP on which the semiconductor chip CHP1 is mounted, and a plurality of leads LD arranged alongside in the x-direction.

Here, the die pad DP has a first side S1 extending in the x-direction, a second side S2 facing the first side S1, a third side S3 intersecting with the first side S1 and the second side S2, and a fourth side S4 facing the third side S3. The semiconductor chip CHP1 has a front surface, and the front surface includes a first region in which the source pad SP1 is formed, a second region in which the source pad SP2 is formed, and a third region located between the first region and the second region in plan view.

The semiconductor chip CHP2 is arranged in the third region via an insulating adhesive member (not shown). Further, the plurality of leads LD includes a lead LD1 extending along the third side S3, a lead LD7 extending along the fourth side S4, leads LD2 to LD6 planarly located between the lead LD1 and the lead LD7, and a relay lead RLD planarly located between the lead LD1 and the lead LD7 and extending along the first side S1.

At this time, the die pad DP is arranged planarly between the lead LD1 and the lead LD7. On the other hand, the relay lead RLD is arranged planarly between the lead LD1 and the lead LD7 in the x-direction, and is arranged planarly between the die pad DP and the leads LD2 to the lead LD6 in the y-direction intersecting with the x-direction.

The relay lead RLD is electrically connected to the source pad SP1 via the wire W5B, and is electrically connected to the source pad SP2 via the wire W6B. The relay lead RLD is connected to each of the lead LD1 and the lead LD7. That is, the relay lead RLD is integrally formed with each of the lead LD1 and the lead LD7. The source pad SP1 is electrically connected to the lead LD1 via a plurality of wires W5A. Further, the source pad SP2 is electrically connected to the lead LD7 via a plurality of wires W6A. As described above, the package structure PKG6 according to the fourth embodiment is configured.

Features in Fourth Embodiment

Next, the feature points in the fourth embodiment will be described.

A characteristic point in the fourth embodiment is, for example, as shown in FIG. 15A, that a relay lead RLD is provided, the relay lead RLD and the source pad SP1 are connected by a wire W5B, and the relay lead RLD and the source pad SP2 are connected by a wire W6B. Thus, according to the fourth embodiment, not only the current path of the source pad SP1→the plurality of wires W5A→the lead LD1 but also the current path of the source pad SP1→the wire W5B→the relay lead RLD→the lead LD1 can be secured. Similarly, not only the current path of the source pad SP2→the plurality of wires W6A→the lead LD7 but also the current path of the source pad SP2→the wire W6B→the relay lead RLD→the lead LD7 can be secured. As described above, according to the fourth embodiment, a large number of current paths can be secured, and as a result, the on-resistance can be reduced.

Modified Example of Fourth Embodiment

Figure 16A:
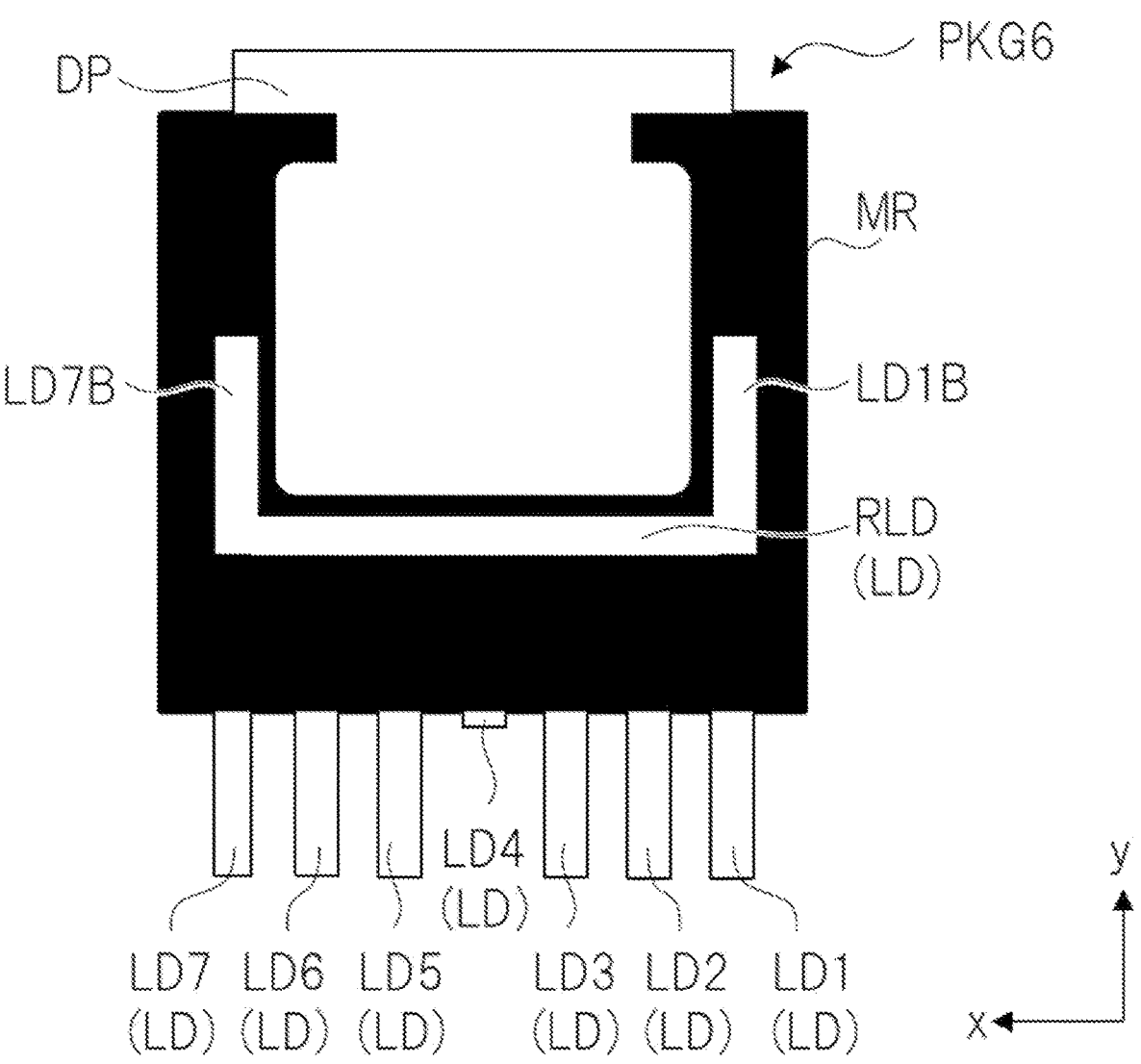
FIG. 16A is a diagram showing a modified example of the fourth embodiment.
Figure 16B:
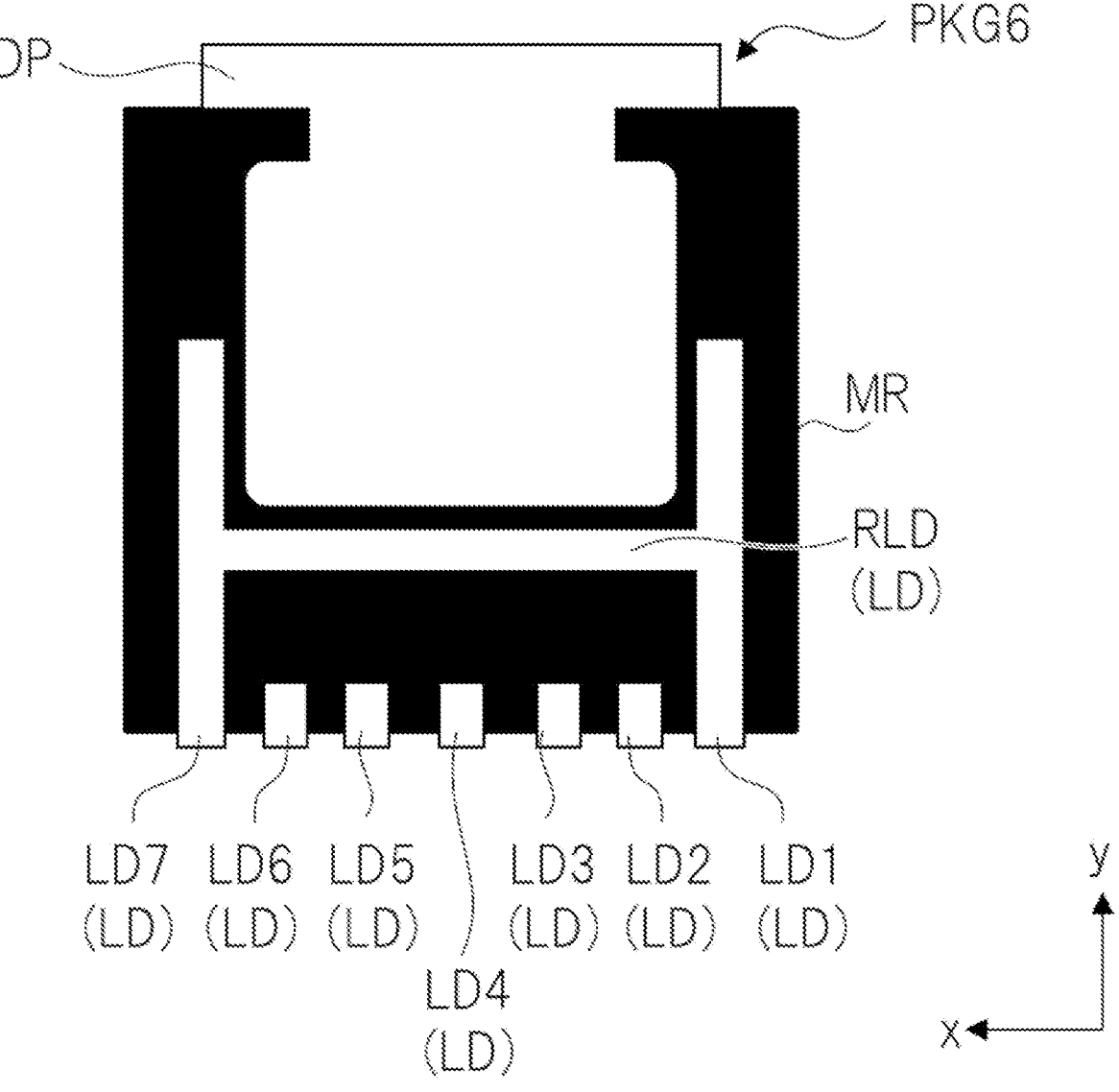
FIG. 16B is a diagram showing another modified example of the fourth embodiment.
Figure 16C:
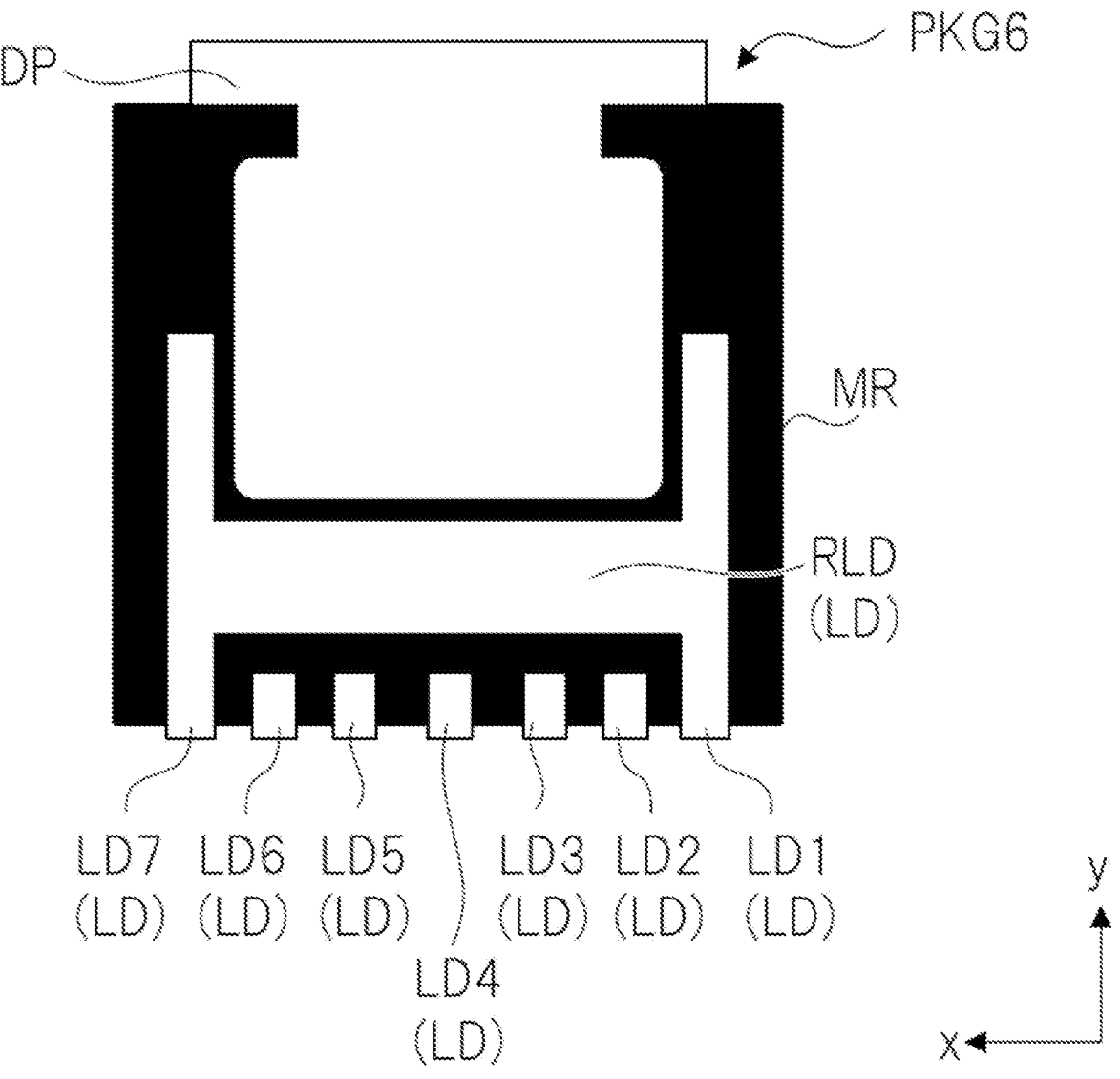
FIG. 16C is a diagram showing yet another modified example of the fourth embodiment.

The electrode configuration exposed from the lower surface (back surface) of the package structure PKG6 is not limited to the back surface exposed electrode structure shown in FIG. 15B, and for example, the back surface exposed electrode structures shown in FIGS. 16A to 16C can be adopted.

In FIG. 16A, differently from FIG. 15B, the relay lead RLD is also exposed from the lower surface of the package structure PKG6. In other words, in FIG. 15B, the relay lead RLD is not exposed from the lower surface of the package structure PKG6. Further, as shown in FIG. 16A, not only the relay lead RLD but also a portion LD1B of the lead LD1 and a portion LD7B of the lead LD7 are exposed from the lower surface of the package structure PKG6.

In addition, in FIG. 16B, differently from FIG. 16A, the entire inner lead portions of the lead LD1 and the lead LD7 electrically connected to the relay lead RLD are also exposed from the lower surface of the package structure PKG6.

Further, in FIG. 16C, differently from FIG. 16B, the width of the relay lead RLD is large and the relay lead RLD having the large width is exposed from the lower surface of the package structure PKG6.

As described above, by adopting the back surface exposed electrode structures shown in FIGS. 16A to 16C, the electrode area exposed from the back surface can be increased, so that the heat dissipation property of the packaging structure PKG6 can be improved.

Fifth Embodiment

Since the package structure PKG7 in the fifth embodiment is substantially the same as the package structure PKG6 in the fourth embodiment, the differences will be mainly described.

Figure 17A:
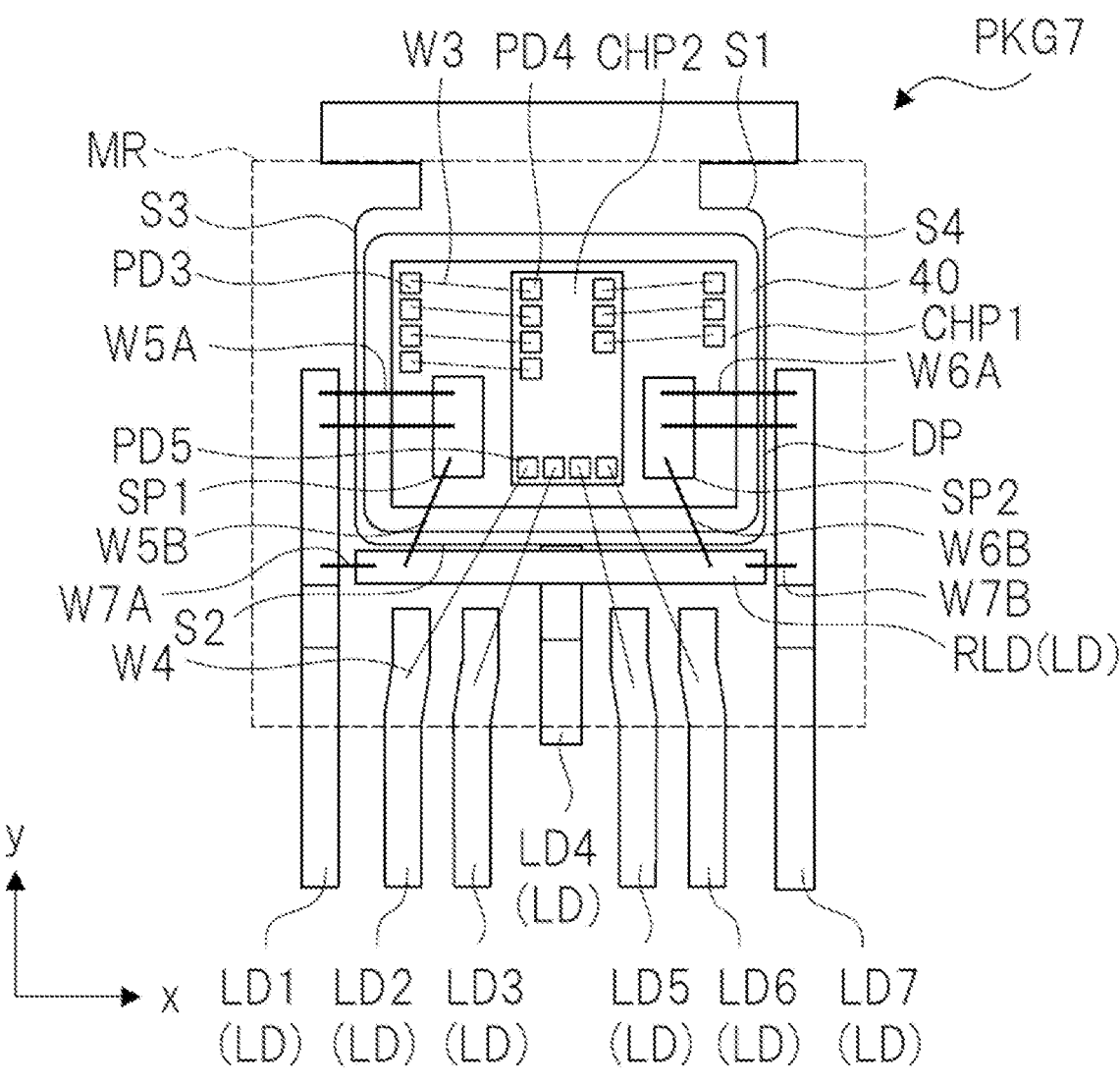
FIG. 17A is a top view of a package structure according to a fifth embodiment seeing through the sealing body.
Figure 17B:
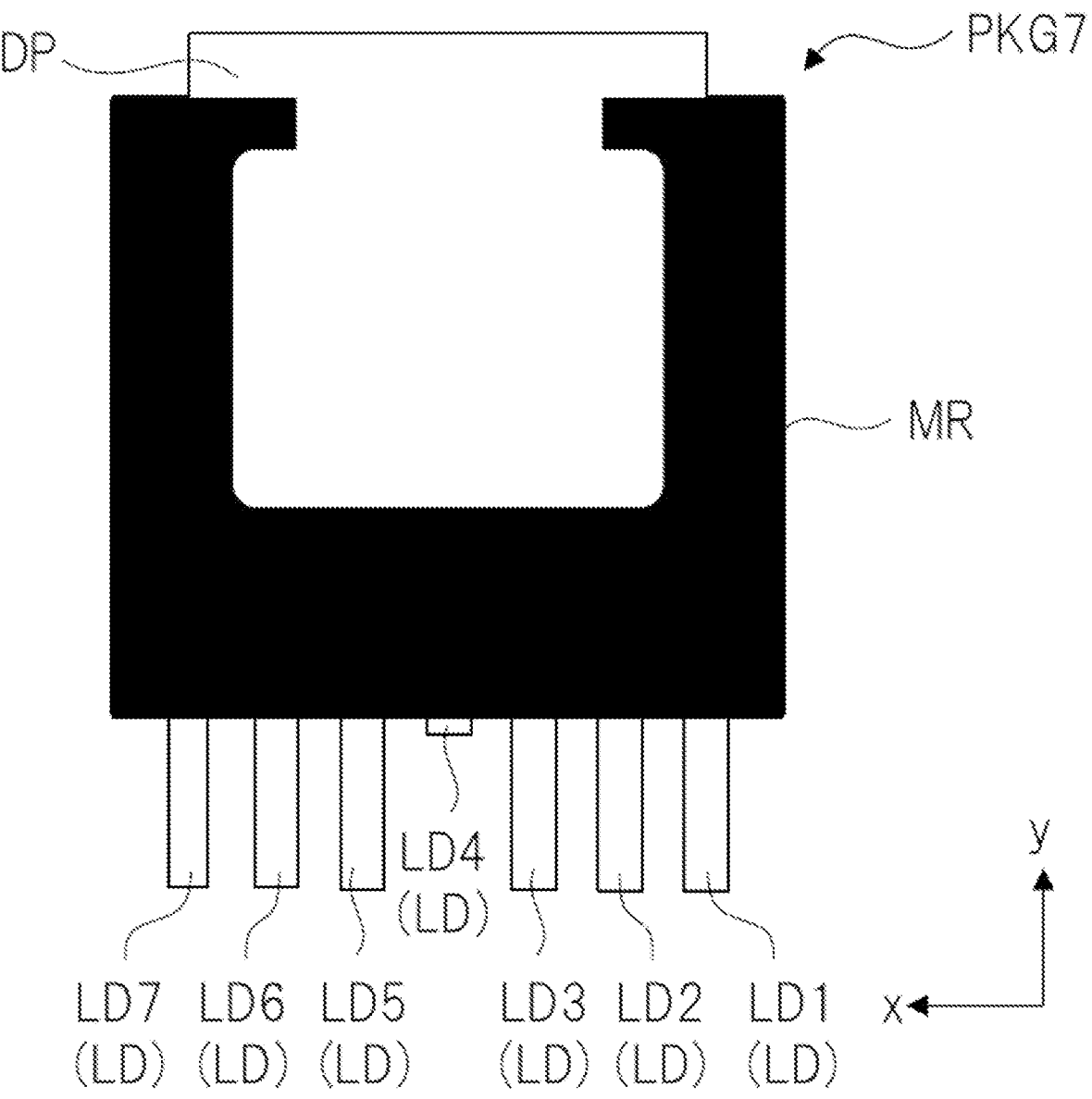
FIG. 17B is a bottom view of the package structure in the fifth embodiment.

FIG. 17A is a top view of a package structure PKG7 seeing through the sealing body MR, and FIG. 17B is a bottom view of the package structure PKG7.

In the fourth embodiment, for example, as shown in FIG. 15A, the relay lead RLD is formed integrally with the lead LD1 and the lead LD7, but in the fifth embodiment, as shown in FIG. 17A, the relay lead RLD is separated from the lead LD1 and the lead LD7, the relay lead RLD and the lead LD1 are connected by a wire W7A, and the relay lead RLD and the lead LD7 are connected by a wire W7B.

In the package structure PKG7 according to the fifth embodiment configured as described above, as in the package structure PKG6 according to the fourth embodiment, a large number of current paths can be secured, so that the on-resistance can be reduced.

Modified Example of Fifth Embodiment

Figure 18A:
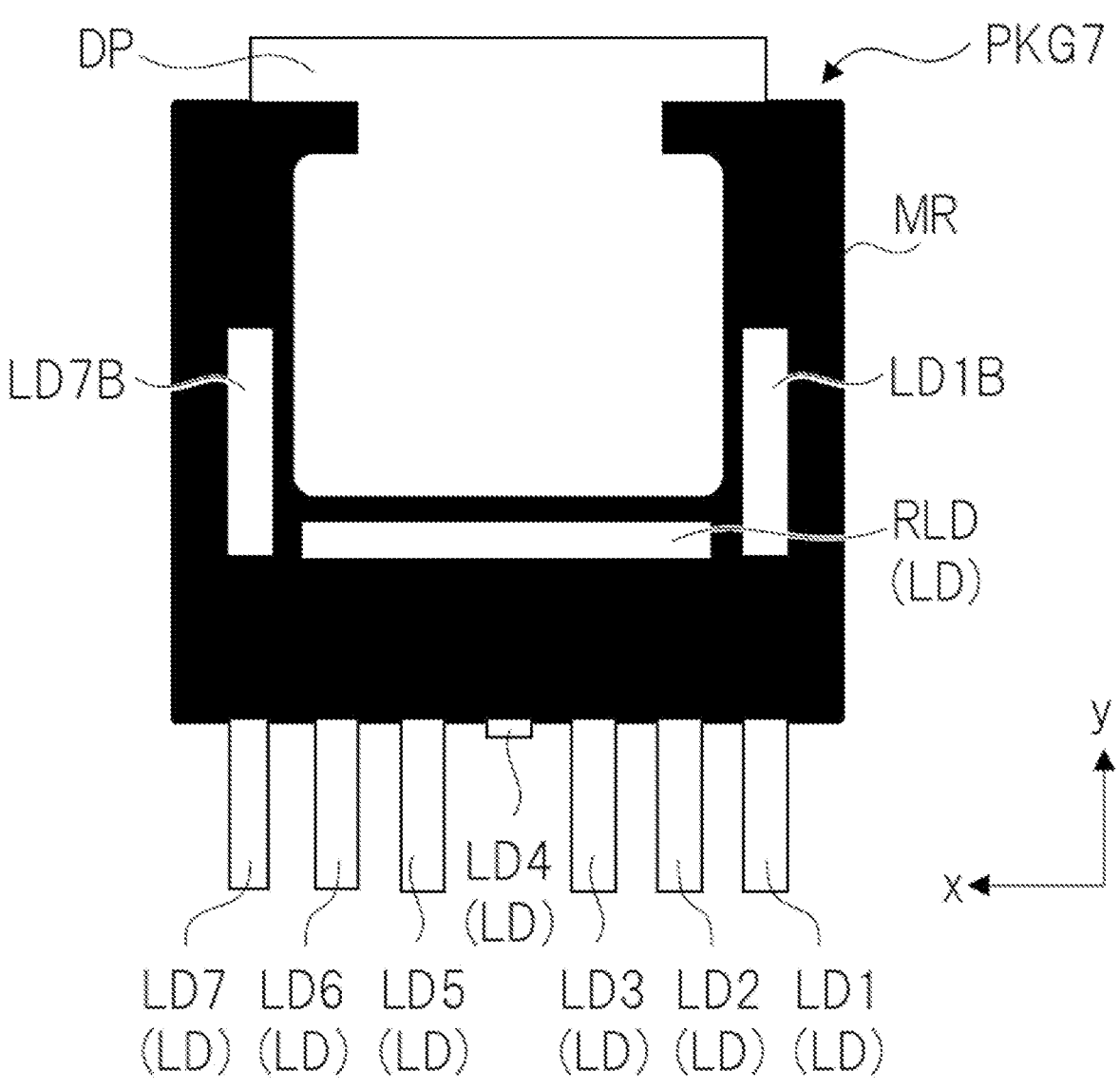
FIG. 18A is a diagram showing a modified example of the fifth embodiment.
Figure 18B:
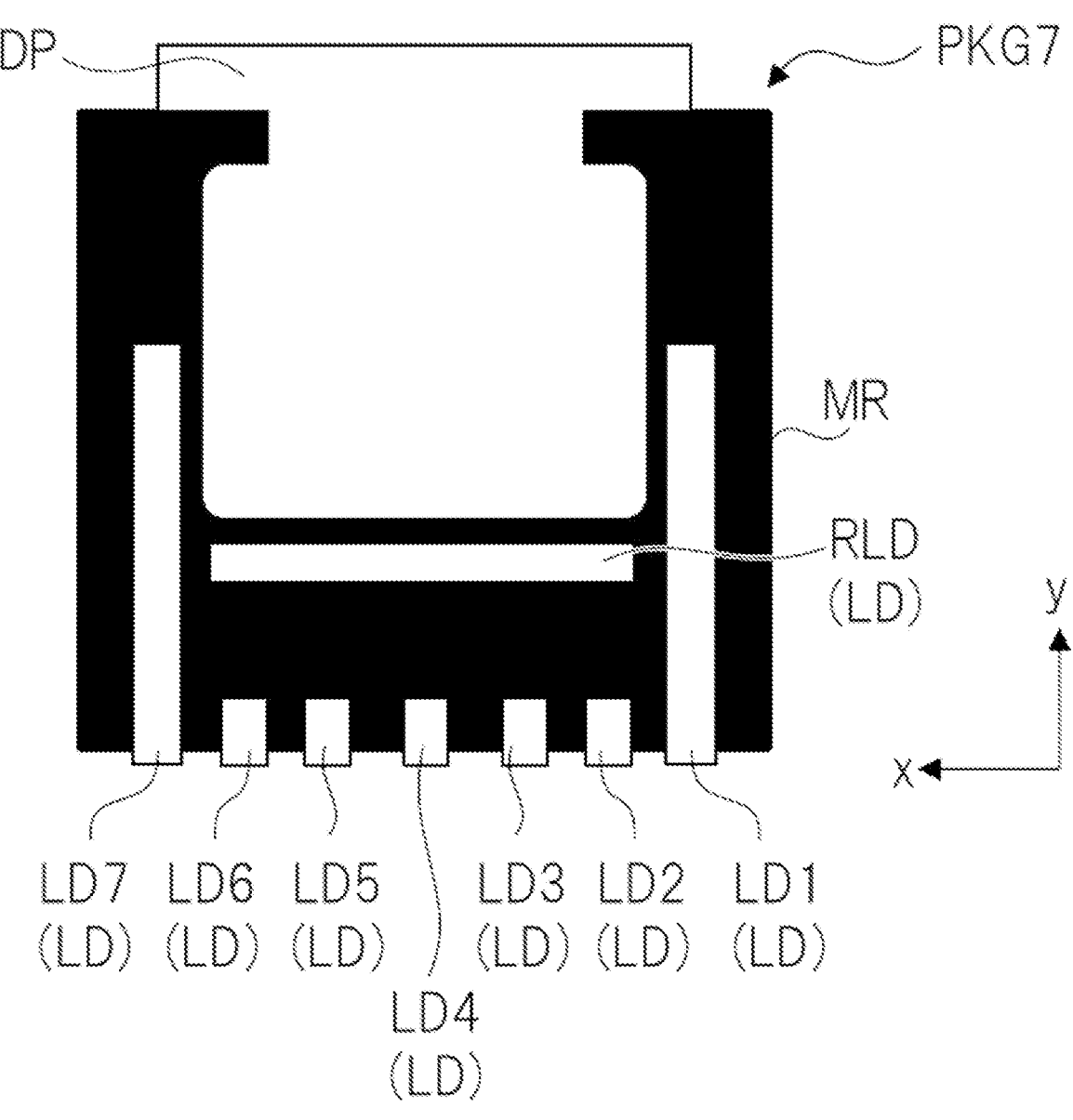
FIG. 18B is a diagram showing another modified example of the fifth embodiment.
Figure 18C:
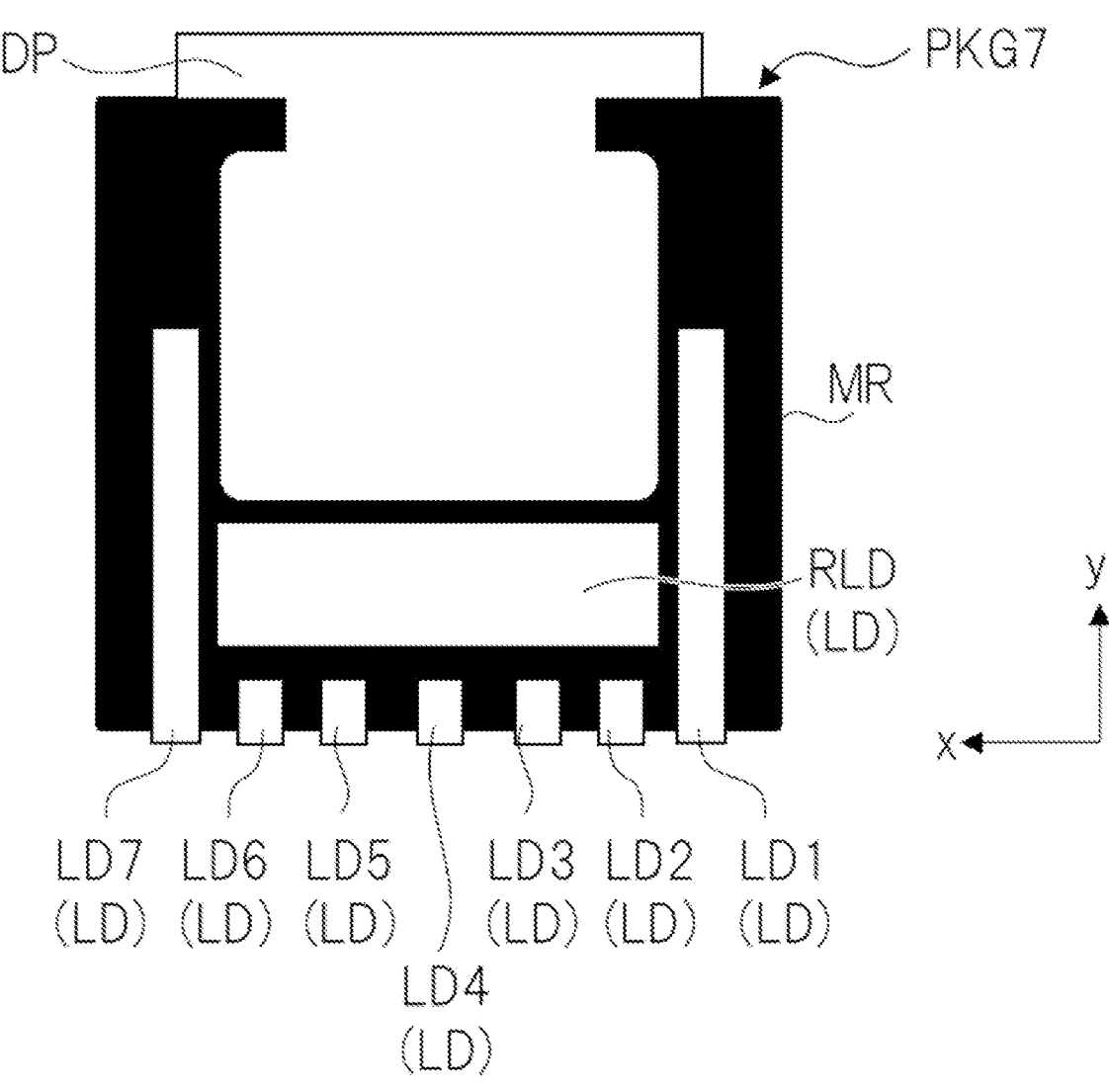
FIG. 18C is a diagram showing yet another modified example of the fifth embodiment.

The electrode configuration exposed from the lower surface (back surface) of the package structure PKG7 is not limited to the back surface exposed electrode structure shown in FIG. 17B, and for example, the back surface exposed electrode structures shown in FIGS. 18A to 18C can be adopted.

In FIG. 18A, differently from FIG. 17B, the relay lead RLD is also exposed from the lower surface of the package structure PKG7. In other words, in FIG. 17B, the relay lead RLD is not exposed from the lower surface of the package structure PKG7. Further, as shown in FIG. 18A, not only the relay lead RLD but also a portion LD1B of the lead LD1 and a portion LD7B of the lead LD7 are exposed from the lower surface of the package structure PKG6.

In addition, in FIG. 18B, differently from FIG. 18A, the entire inner lead portions of the lead LD1 and the lead LD7 electrically connected to the relay lead RLD are also exposed from the lower surface of the package structure PKG7.

Further, in FIG. 18C, differently from FIG. 18B, the width of the relay lead RLD is large and the relay lead RLD having the large width is exposed from the lower surface of the package structure PKG7.

As described above, by adopting the back surface exposed electrode structures shown in FIGS. 18A to 18C, the electrode area exposed from the back surface can be increased, so that the heat dissipation property of the packaging structure PKG6 can be improved.

Sixth Embodiment

Configuration of Package Structure in Sixth Embodiment

Figure 19:
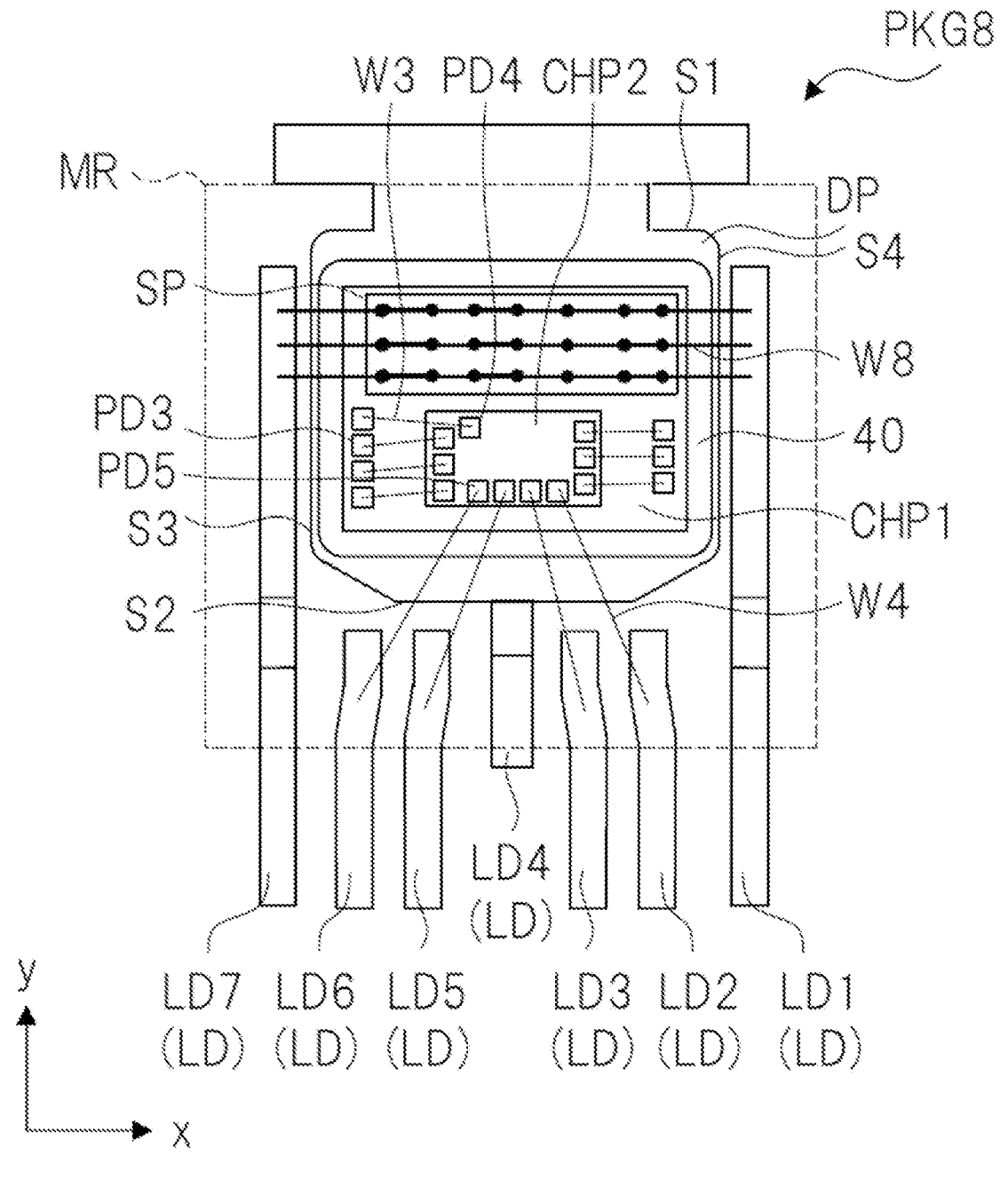
FIG. 19 is a top view of a package structure according to a sixth embodiment seeing through the sealing body.

FIG. 19 is a top view of the package structure PKG8 seeing through the sealing body MR.

In FIG. 19, the package structure PKG8 according to the fifth embodiment includes a semiconductor chip CHP1 in which a power transistor is formed, a semiconductor chip CHP2 in which a control circuit for controlling the power transistor is formed, a die pad DP on which the semiconductor chip CHP1 is mounted, and a plurality of leads LD arranged alongside in the x-direction.

Here, the die pad DP has a first side S1 extending in the x-direction, a second side S2 facing the first side S1, a third side S3 intersecting with the first side S1 and the second side S2, and a fourth side S4 facing the third side S3. The semiconductor chip CHP1 has a front surface, and the front surface includes a first region in which a source pad SP extending in the x-direction is formed, and a second region arranged on the side of the second side than the first region.

The semiconductor chip CHP2 is arranged on the second region via an insulating adhesive member (not shown). The plurality of leads includes a lead LD1 extending along the third side S3 and a lead LD7 extending along the fourth side S4.

At this time, the die pad DP is arranged planarly between the lead LD1 and the lead LD7, and the lead LD1, the source pad SP, and the lead LD7 are connected by a plurality of wires W8 extending in the x-direction. In this way, the package structure PKG8 is configured.

Features in Sixth Embodiment

Next, feature points in the sixth embodiment will be described.

A feature point of the sixth embodiment is that, for example, as shown in FIG. 19, on the premise that the source pad SP and the semiconductor chip CHP2 extending in the x-direction are arranged so that they stand in line in the y-direction, the lead LD1, the source pad SP, and the lead LD7 are connected by a plurality of wires W8 extending in the x-direction. Thus, according to the sixth embodiment, an on-resistance reduction similar to the on-resistance reduction in the third embodiment can be achieved, and the joint area of the wire W8 and the source pad SP can also be provided in the vicinity of the center of the semiconductor chip CHP1, thereby reducing the surface-potential gradient. That is, according to the sixth embodiment, in addition to the effect of reducing the on-resistance by the similar configuration to that of the third embodiment, the effect of reducing the on-resistance by reducing the surface potential gradient can also be obtained.

Modified Example of Sixth Embodiment

Figure 20A:
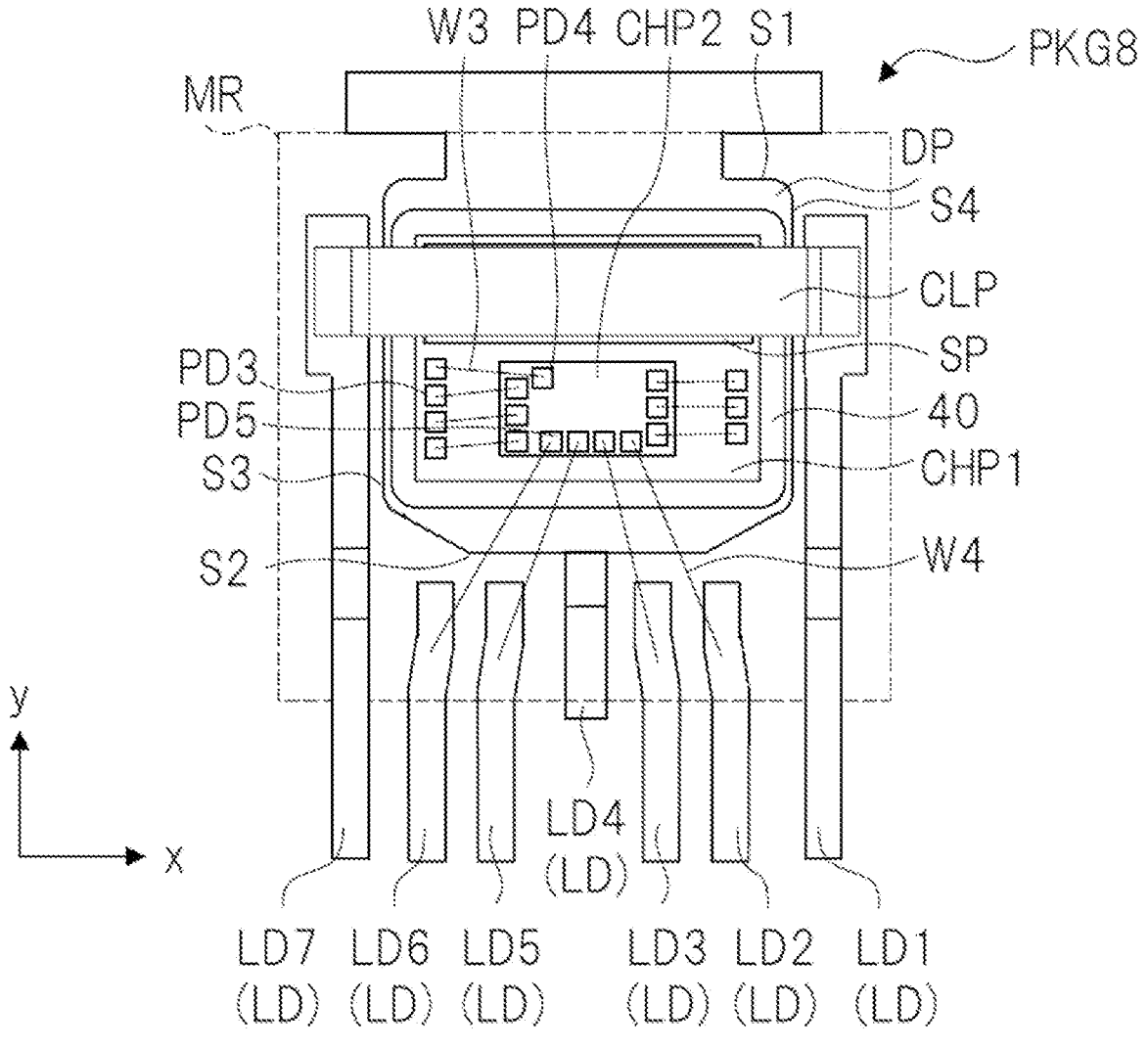
FIG. 20A is a diagram showing a modified example of the sixth embodiment.
Figure 20B:
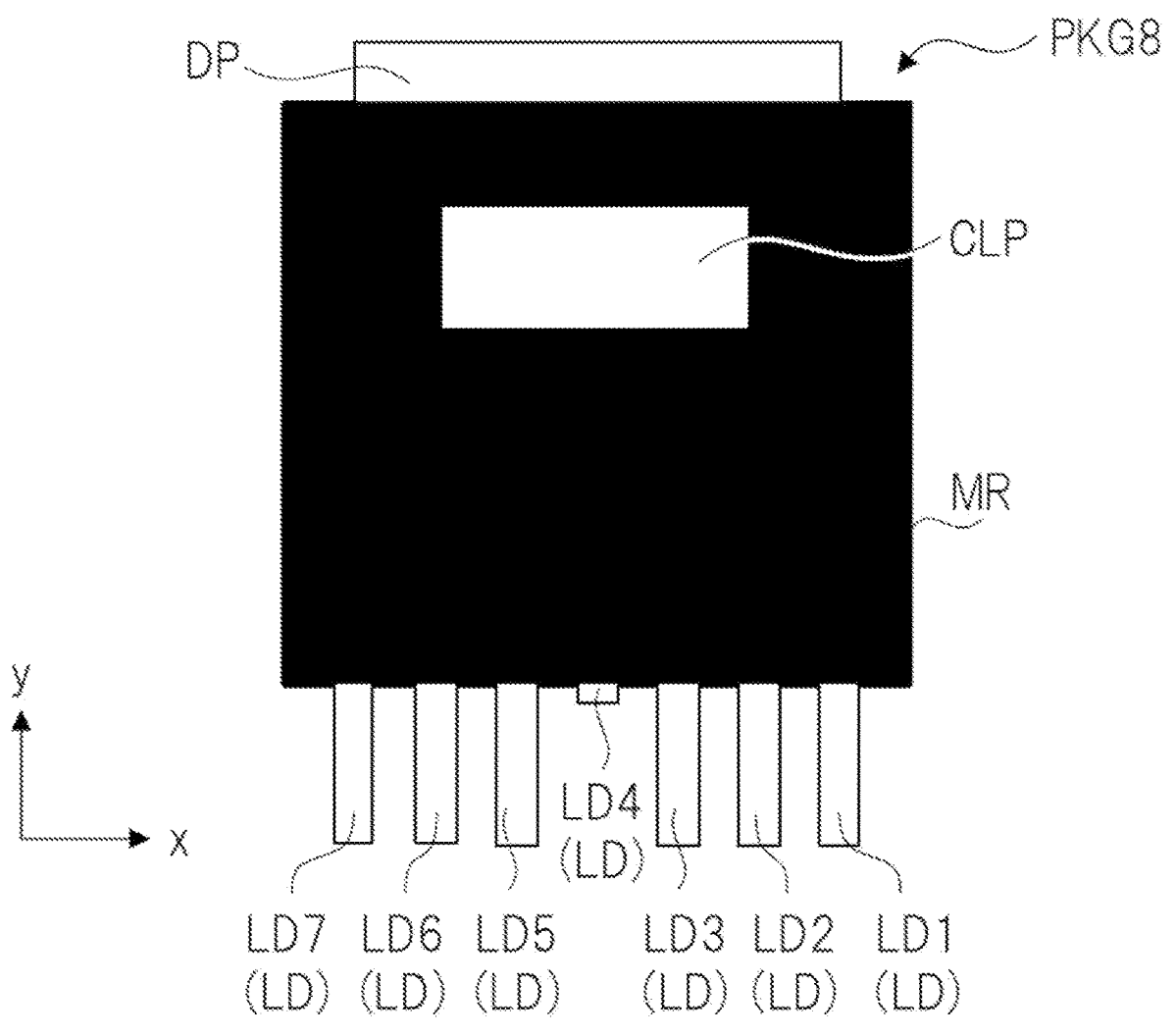
FIG. 20B is a diagram showing another modified example of the sixth embodiment.
Figure 20C:
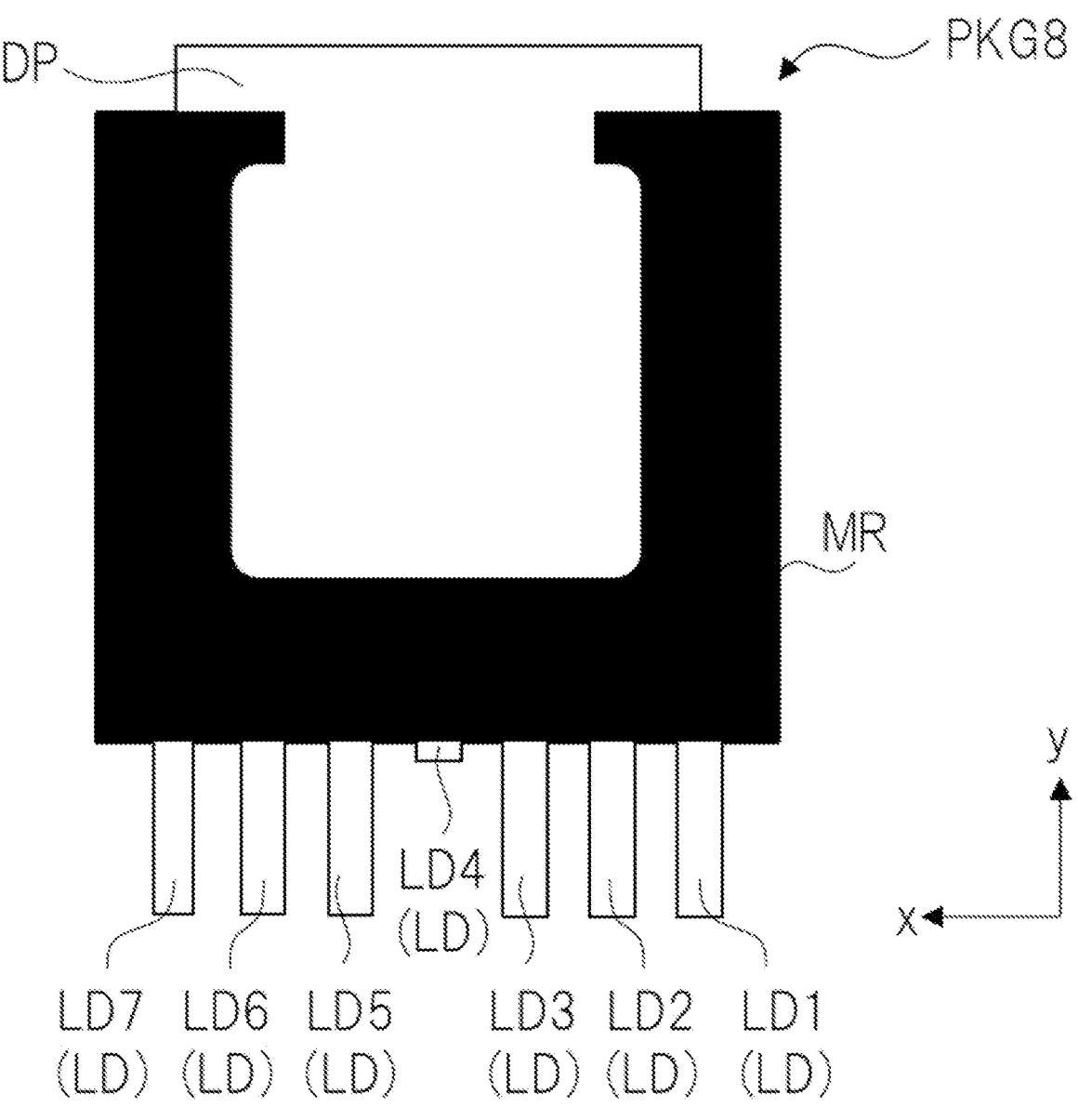
FIG. 20C is a diagram showing yet another modified example of the sixth embodiment.

In the sixth embodiment, the lead LD1, the source pad SP, and the lead LD7 are connected by a plurality of wires W8 extending in the x-direction, but the present invention is not limited thereto, and for example, as shown in 20A, a configuration in which the lead LD1, the source pad SP, and the lead LD7 are connected by a clip CLP extending in the x-direction may be adopted. In this regard, from the viewpoint of improving the heat dissipation properties of the package structure PKG8, it is desirable not only to expose the die pad DP from the lower surface of the sealing member MR as shown in FIG. 20C but also to expose the clip CLP from the upper surface of the sealing member MR as shown in 20B.

The invention made by the present inventors has been described above in detail based on the embodiments, but the present invention is not limited to the embodiments described above, and various modifications can of course be made without departing from the gist thereof.

In the above-described embodiments, descriptions are presented assuming a power MOSFET as the power transistor formed in the semiconductor chip, but the technical ideas in the above-described embodiments are not limited thereto, and can be widely applied to a semiconductor device using, for example, IGBT (Insulated Gate Bipolar Transistor) as a power transistor. In this case, the "source pad" is read as an "emitter pad". Further, in the claims, "conductive adhesive member" is used as a term including "silver paste" and "solder".

What is claimed is:

1. A semiconductor device comprising:
a chip mounting portion;
a plurality of leads;
a first semiconductor chip having a power transistor and mounted on the chip mounting portion; and
a second semiconductor chip having a control circuit which controls the power transistor, the second semiconductor chip being mounted on the first semiconductor chip,
wherein the first semiconductor chip has:
a first front surface;
a first back surface opposite the first front surface;
a source pad formed in the first front surface and electrically connected to a source of the power transistor; and
a gate pad formed in the first front surface and electrically connected to a gate of the power transistor,
wherein the second semiconductor chip has:
a first pad electrically connected to the control circuit; and
a second pad electrically connected to the control circuit,
wherein the first pad of the second semiconductor chip is electrically connected to a second lead of the plurality of leads via a first bonding wire made of a material which is one of gold and copper as a main component,
wherein the second pad of the second semiconductor chip is electrically connected to the gate pad of the first semiconductor chip via a second bonding wire made of a material which is one of gold and copper as a main component,
wherein the source pad of the first semiconductor chip is electrically connected to a first lead of the plurality of leads via a plate-shaped member made of a material which is copper as a main component, and
wherein, in plan view, a width of the plate-shaped member is larger than a width of each of the first bonding wire and the second bonding wire.

2. The semiconductor device according to claim 1,
wherein the chip mounting portion has an upper surface and a lower surface opposite the upper surface,
wherein the plurality of leads is arranged along a first side of the chip mounting portion,
wherein the semiconductor device has a sealing body sealing the first semiconductor chip and the second semiconductor chip such that a portion of each of the lower surface of the chip mounting portion and the plurality of leads is exposed from the sealing body,
wherein the first semiconductor chip has a drain electrode formed on the first back surface and electrically connected to a drain of the power transistor, wherein the second semiconductor chip has:
a second front surface;
a second back surface opposite the second front surface;
the first pad formed in the second front surface; and
the second pad formed in the second front surface,
wherein the first semiconductor chip is mounted on the upper surface of the chip mounting portion via a conductive adhesive member such that the first back surface faces the upper surface of the chip mounting portion,
wherein the second semiconductor chip is mounted on the first front surface of the first semiconductor chip via an insulating adhesive member such that the second back surface faces the first front surface of the first semiconductor chip,
wherein the drain electrode of the first semiconductor chip is electrically connected to the chip mounting portion via the conductive adhesive member, and
wherein a third lead of the plurality of leads is connected to the chip mounting portion.

3. The semiconductor device according to claim 2,
wherein the lower surface of the chip mounting portion is exposed from the sealing body, and
wherein an upper surface of the plate-shaped member is exposed from the sealing body.

4. The semiconductor device according to claim 1,
wherein the source pad is comprised of a first source pad and a second source pad,
wherein the first front surface of the first semiconductor chip has:
a first region in which the first source pad is formed;
a second region in which the second source pad is formed; and
a third region located between the first region and the second region in plan view,
wherein the plurality of leads includes:
the first lead arranged closer to the first region than to the second region; and
a fourth lead arranged closer to the second region than to the first region,
wherein the second semiconductor chip is arranged on the third region via an insulating adhesive member,
wherein the plate-shaped member is arranged above the second semiconductor chip such that the plate-shaped member extends across the second semiconductor chip, and
wherein the plate-shaped member is arranged on the first source pad, the second source pad, the first lead and the fourth lead via a first conductive member, a second conductive member, a third conductive member and a fourth conductive member, respectively.

5. The semiconductor device according to claim 4, wherein a bending processing is applied to the plate-shaped member.

6. The semiconductor device according to claim 4,
wherein a first spacer exists between the plate-shaped member and the first region,
wherein a second spacer exists between the plate-shaped member and the second region, and
wherein a bending processing is not applied to the plate-shaped member.

7. The semiconductor device according to claim 4,
wherein the plurality of leads is arranged alongside in a first direction, and wherein all leads other than the first lead and the fourth lead of the plurality of leads are arranged between the first lead and the fourth lead.

8. The semiconductor device according to claim 1, wherein the plate-shaped member is arranged on the first semiconductor chip via a conductive adhesive member, and wherein the second semiconductor chip is arranged on the plate-shaped member via an insulating adhesive member.

9. The semiconductor device according to claim 8, wherein an opening is provided in the plate-shaped member, wherein a third pad is formed in the first front surface of the first semiconductor chip exposed from the opening, wherein a fourth pad is formed in a second front surface of the second semiconductor chip, and wherein the third pad and the fourth pad are connected with a wire.

10. The semiconductor device according to claim 8, wherein a first unevenness shape is formed in a lower surface of the plate-shaped member, and wherein a second unevenness shape is formed in an upper surface of the plate-shaped member.

11. The semiconductor device according to claim 8, wherein the plurality of leads is arranged alongside in a first direction, wherein a composite lead connected to the plate-shaped member is included in the plurality of leads, and wherein the composite lead includes:

a post connected to the plate-shaped member via a conductive adhesive member;

the first lead connected to the post; and a fifth lead connected to the post.

12. The semiconductor device according to claim 11, wherein a through hole is formed in the plate-shaped member, and wherein the plate-shaped member is connected to the composite lead such that a through hole overlapping with the post is filled with the conductive adhesive member.

13. The semiconductor device according to claim 12, wherein a trench is formed in the post, and wherein the through hole is arranged inside the trench.

14. The semiconductor device according to claim 8, wherein the chip mounting portion has:

a first side extending in a first direction;

a second side facing the first side;

a third side intersecting with the first side and the second side; and a fourth side facing the third side, wherein the plurality of leads includes:

the first lead arranged along the third side; and a sixth lead arranged along the fourth side, wherein the plate-shaped member is connected to the first lead via a first conductive adhesive member, and wherein the plate-shaped member is connected to the sixth lead via a second conductive adhesive member.

15. The semiconductor device according to claim 14, wherein the plurality of leads includes a lead arranged alongside in the first direction.

16. A semiconductor device comprising:

a first semiconductor chip in which a power transistor is formed;

a second semiconductor chip in which a control circuit is formed, the control circuit controlling the power transistor;

a plurality of bonding wires electrically connected to the power transistor;

a chip mounting portion on which the first semiconductor chip is mounted; and a plurality of leads electrically connected to the plurality of bonding wires, respectively, wherein the chip mounting portion has:

a first side extending in a first direction;

a second side facing the first side;

a third side intersecting with the first side and the second side; and a fourth side facing the third side, wherein the plurality of leads is arranged alongside in the first direction, wherein the plurality of leads has:

a first lead extending along the third side; and a second lead extending along the fourth side, wherein the first lead extends to a position adjacent to the third side, wherein the second lead extends to a position adjacent to the fourth side, wherein the plurality of bonding wires has:

a first bonding wire electrically connected to the first lead, and a second bonding wire electrically connected to the second lead, wherein a joint portion of the first bonding wire and the first lead is located at a position adjacent to the third side, and wherein a joint portion of the second bonding wire and the second lead is located at a position adjacent to the fourth side.

17. The semiconductor device according to claim 16, wherein the first semiconductor chip has a front surface;

wherein the front surface includes:

a first region in which a first source pad is formed;

a second region in which a second source pad is formed; and a third region located between the first region and the second region in plan view, wherein the second semiconductor chip is arranged on the third region via an insulating adhesive member, wherein the chip mounting portion is arranged planarly between the first lead and the second lead, wherein the first source pad is connected to the first lead via the first bonding wire, and wherein the second source pad is connected to the second lead via the second bonding wire.

18. The semiconductor device according to claim 17, wherein the first bonding wire is orthogonal to the third side, and wherein the second bonding wire is orthogonal to the fourth side.

19. The semiconductor device according to claim 16, wherein the first semiconductor chip has a front surface;

wherein the front surface includes:

a first region in which a first source pad is formed;

a second region in which a second source pad is formed; and a third region located between the first region and the second region in plan view, wherein the second semiconductor chip is arranged on the third region via an insulating adhesive member, wherein the plurality of leads has:

a third lead planarly located between the first lead and the second lead; and a relay lead planarly located between the first lead and the second lead and extending along the first side, wherein the chip mounting portion is arranged planarly between the first lead and the second lead, wherein the relay lead is arranged planarly between the first lead and the second lead in the first direction and is arranged planarly between the chip mounting portion and the third lead in a second direction intersecting with the first direction, and wherein the relay lead is connected to the first source pad via a first bonding wire, is connected to the second source pad via a second bonding wire, is electrically connected to the first lead and is electrically connected to the second lead.

* * * * *